(12) United States Patent
Kimura et al.

(10) Patent No.: US 10,889,899 B2
(45) Date of Patent: Jan. 12, 2021

(54) CERAMIC LAMINATE, CERAMIC INSULATING SUBSTRATE, AND METHOD FOR MANUFACTURING CERAMIC LAMINATE

(71) Applicant: NIPPON STEEL & SUMITOMO METAL CORPORATION, Tokyo (JP)

(72) Inventors: Keiichi Kimura, Tokyo (JP); Keisuke Tokuhashi, Tokyo (JP); Tomohiro Uno, Tokyo (JP); Yutaka Sato, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 156 days.

(21) Appl. No.: 15/999,792

(22) PCT Filed: Feb. 17, 2017

(86) PCT No.: PCT/JP2017/006004
§ 371 (c)(1),
(2) Date: Aug. 20, 2018

(87) PCT Pub. No.: WO2017/142090
PCT Pub. Date: Aug. 24, 2017

(65) Prior Publication Data
US 2020/0071836 A1 Mar. 5, 2020

(30) Foreign Application Priority Data
Feb. 19, 2016 (JP) .................................. 2016-030501

(51) Int. Cl.
*C23C 24/04* (2006.01)
*H01L 23/15* (2006.01)
(52) U.S. Cl.
CPC .............. *C23C 24/04* (2013.01); *H01L 23/15* (2013.01)

(58) Field of Classification Search
CPC ................................ C23C 24/04; H01L 23/15
(Continued)

(56) References Cited

U.S. PATENT DOCUMENTS

2010/0211158 A1 8/2010 Haverty et al.
2013/0288037 A1 10/2013 Sun et al.
(Continued)

FOREIGN PATENT DOCUMENTS

JP 2000-344569 A 12/2000
JP 2002-4029 A 1/2002
(Continued)

OTHER PUBLICATIONS

Korean Office Action, dated Jan. 22, 2020, for Korean Application No. 10-2018-7023122, with an English translation.
(Continued)

*Primary Examiner* — William K Cheung
(74) *Attorney, Agent, or Firm* — Birch, Stewart, Kolasch & Birch, LLP

(57) ABSTRACT

A ceramic laminate improving the mechanical characteristics of a composite ceramic layer which has excellent thermal fatigue resistance, thermal conductivity, and insulation ability and having excellent durability and heat dissipation and insulation ability and a ceramic insulating substrate and a method of production of a ceramic laminate are provided. In a cross-section perpendicular to the bonding interfaces, the average size of the second phase particles 3 is 0.02 μm to 0.3 μm and the average value of the ratio of the long axis and short axis of an equivalent ellipse when viewing a second phase particle 3 as an ellipse is 2 to 10. Further, 60% or more of the number of the second phase particles 3 has an orientation angle of 30° or less while the average orientation angle is 5° to 35°.

20 Claims, 5 Drawing Sheets

(58) Field of Classification Search
USPC .......................................................... 428/328
See application file for complete search history.

(56) References Cited

U.S. PATENT DOCUMENTS

2014/0349073 A1   11/2014   Sun et al.
2017/0018697 A1*  1/2017   Konishi ................. H05K 1/053

FOREIGN PATENT DOCUMENTS

| JP | 3784341 B2 | 6/2006 |
| JP | 3937952 B2 | 6/2007 |
| JP | 2008-196012 A | 8/2008 |
| JP | 2009-179847 A | 8/2009 |
| JP | 2010-232580 A | 10/2010 |
| JP | 4784150 B2 | 10/2011 |
| JP | 2013-32265 A | 2/2013 |
| JP | 2013-159816 A | 8/2013 |
| JP | 2015-522710 A | 8/2015 |
| JP | 5842457 B2 | 1/2016 |
| TW | 201501204 A | 1/2015 |
| WO | WO 03/011782 A2 | 2/2003 |
| WO | WO 2013/126466 A1 | 8/2013 |
| WO | WO 2013/162909 A1 | 10/2013 |
| WO | WO 2014/018830 A1 | 1/2014 |
| WO | WO 2014/190211 A1 | 11/2014 |

OTHER PUBLICATIONS

Matsumura et al., "Strength Degradation in Ceramic Substrate by Thermal Fatigue," Proceedings of the Annual Meeting of the Japan Society of Mechanical Engineers, J031044, Sep. 11-14, 2011, 5 pages with English abstract.

Matsumura, "Standardization of Testing Method for Thermal Fatigue of Fine Ceramics Substrate," Ceramic, vol. 48, No. 10, 2013, pp. 806-809.

European Communication pursuant to Rules 70(2) and 70a(2) EPC, dated Jan. 10, 2020, providing the Extended European Search Report, dated Dec. 17, 2019, for European Application No. 17753344.5.

* cited by examiner

CERAMIC LAMINATE, CERAMIC INSULATING SUBSTRATE, AND METHOD FOR MANUFACTURING CERAMIC LAMINATE

This international application is a Section 371 National Stage Application of International Application No. PCT/JP2017/006004, filed Feb. 17, 2017, which claims the benefit of Japanese Patent Application No. 2016-030501 filed on Feb. 19, 2016 with the Japan Patent Office, the entire disclosures of which are incorporated herein by reference.

FIELD

This invention relates to a ceramic laminate comprised of a composite ceramic layer of alumina-zirconia ($Al_2O_3$—$ZrO_2$) having excellent strength, fracture toughness, wear resistance, thermal conductivity, heat dissipation ability, and insulation ability to which a base member layer is bonded and a method of production of the same. More particularly, it relates to a ceramic insulating substrate used for a power semiconductor device handling a relatively high current and voltage and a conveyor roll requiring wear resistance and other high mechanical characteristics at the surface.

BACKGROUND

A ceramic laminate comprised of a base member covered by or bonded with a ceramic for providing it with excellent strength, fracture toughness, wear resistance, thermal conductivity, heat dissipation ability, and insulation ability is utilized in various fields as structural members in rolling, conveyor rolls, furnace walls, etc. and functional members such as ceramic insulating circuit boards. The ceramic used varies depending on the application. To obtain high characteristics in these various applications, in particular alumina ($Al_2O_3$), aluminum nitride (AlN), silicon nitride ($Si_3N_4$), zirconia ($ZrO_2$), and other fine ceramics raised in purity and criteria for control of components are being used.

Among these, alumina, zirconia, and other oxides are relatively inexpensive and frequently used, but alumina is inferior to silicon nitride in terms of strength while zirconia is the most inferior in thermal conductivity among the above four types of ceramics. To make up for these defects, there are ceramics obtained by mixing alumina and zirconia to form a two-phase structure. These ceramics are structured as a first phase of a high volume ratio among the alumina phase and zirconia phase in which second phase particles of a low volume ratio are dispersed. These are called alumina-dispersed zirconia, zirconia-dispersed alumina, zirconia-reinforced alumina, and alumina-reinforced zirconia. The present invention refers to these materials all together as an "alumina-zirconia ceramic" or simply a "composite ceramic". A layer formed by a composite ceramic (alumina-zirconia ceramic) is called a "composite ceramic layer".

One of the strengthening and toughening mechanisms of an alumina-zirconia ceramic is the mechanism of using a stress field formed by mixture of the two phases to obstruct the progression of a crack. A zirconia phase, which is controlled in crystal structure, is higher in strength or fracture toughness than an alumina phase. A mechanism where the zirconia phase undergoes stress-induced transformation and thereby absorbs the energy at the front of a crack can be realized. Further, when making the zirconia phase the second phase particles, a microcrack formed in a second phase particle can make the direction of crack progression disperse at the front of a large crack progressing due to stress. Due to these mechanisms, looking at the mechanical properties of the alumina-zirconia ceramic, mechanical characteristics better than ceramics of single phases of alumina and zirconia are considered to be obtained. Therefore, in an alumina-zirconia ceramic, these are greatly affected by the void rate or void size, residual stress field, and structural state of the first phase plus, in particular, the size, form, and state of dispersion of the second phase particles. Control of these becomes important.

As the general method of production of an alumina-zirconia ceramic, the method of mixing and sintering these powders is adopted. Sintering is a process where feedstock particles bond together and grow resulting in densification, so the particle size and form of the sintered ceramic are restricted by the size of the feedstock particles. The particles will not become finer than that. In an alumina-zirconia ceramic, to promote the densification by sintering, sometimes silica ($SiO_2$), magnesia (MgO), or another sintering aid is added. These end up forming phases other than the alumina phase and zirconia phase in the sintered body and sometimes detract from the mechanical characteristics and corrosion resistance.

As the method of formation of a ceramic having a constant thickness other than the sintering method, the thermal spraying method and aerosol deposition method may be mentioned. With the thermal spraying method, the ceramic becomes a molten state, so obtaining a fine structure is difficult.

On the other hand, the aerosol deposition method mixes a solid fine powder feedstock with a gas to form an aerosol which it sprays toward and deposits on the base member inside the vacuum chamber. It is characterized in that a ceramic layer can be formed at an ordinary temperature (PTLs 1 and 2). By using a mixed powder comprised of different substances as the feedstock powder, a composite film can be expected to be obtained. However, due to the different conditions suitable for formation of a film by these powders, formation of a dense and thick composite film is not easy. There are no known successful examples of formation of a film of an alumina-zirconia ceramic. The structure of the composite ceramic and the mechanical characteristics and electrical characteristics reflected in the same are not known.

As one application of an alumina-zirconia ceramic, there is a ceramic insulating substrate used bonded with a metal layer. Here, a "ceramic insulating substrate" is a substrate giving electrical insulation due to the ceramic. It is given various functions and forms such as a ceramic insulating circuit board, heat sink, and heat spreader.

In ceramic insulating substrates, substrates for carrying silicon, silicon carbide, gallium nitride, and other semiconductors and forming electrical circuits are called "ceramic insulating circuit boards" or simply "ceramic substrates". Ceramic insulating circuit boards are comprised of insulators of sheet-shaped ceramic layers on one side or both sides of which copper or aluminum conducting electricity or heat well is bonded. When bonded with metal on the two sides, one side often becomes the circuit surface for mounting a semiconductor chip while the opposite side becomes the bonding surface with a heat sink for dissipating heat.

The typical thickness of the ceramic used for a ceramic insulating substrate is 0.2 mm to 0.6 mm. A sintered body obtained by firing a raw ceramic formed into a sheet shape by the doctor blade method or roll compaction method at 1300° C. or more is used.

As the ceramic material, alumina, which is excellent in insulation ability, strong in strength, and excellent in thermal conductivity, aluminum nitride, which is more excellent in thermal conductivity than alumina, silicon nitride, which is stronger than alumina, and other sintered body substrates are usually used. An alumina-zirconia ceramic is also partially used as a high strength, high toughness ceramic.

A ceramic layer and a metal layer are mainly bonded by the brazing method of bonding through an Ag—Cu—Ti alloy or other active metal braze or Mo—Mn metallized layer or the direct bonding method (DCB method) of making a Cu—$Cu_2O$ eutectic system form at the interface of a ceramic layer and copper layer, then cooling it to thereby directly bond with the copper layer.

These bonding methods bond at temperatures between 800° C. to 1080° C., so thermal stress is generated due to the difference in thermal expansion rates between the ceramic layer and the metal layer. There is the problem that this residual stress is further increased by thermal stress due to the process of mounting the semiconductor or peripheral devices on the ceramic insulating substrate or the repeated thermal cycle at the time of use leading to fracture of the ceramic layer. In particular, near the bonding interfaces of the metal layer and ceramic layer at the ceramic side of the end of the metal circuit, the residual tensile stress generated at the time of bonding and the thermal and mechanical stress received at the time of use are superposed often leading to fracture (NPLs 1 and 2). According to NPL 1, the tensile residual stress generated at the end part of the copper layer of the bonding interfaces of the ceramic insulating substrate (Cu/$Al_2O_3$) fabricated by the DCB method is a maximum 105 MPa. If a thermal cycle is added to this, it is calculated that a maximum 360 MPa tensile stress will be reached.

On the other hand, the thermal spraying method heats the ceramic until a temperature where it melts, so the problem of thermal stress is unavoidable.

In the future, it is expected that use of vehicle-mounted applications and silicon carbide semiconductors will increase and that the usage temperatures will become higher and the range of usage temperatures will become greater. In power semiconductors, the amount of input power will also become greater. Due to the need for raising the heat dissipation ability, increase of the thickness of the copper layer and decrease of the thickness of the ceramic layer are being sought, but due to the problem of warping resulting from the thermal stress caused by the difference in coefficients of thermal expansion, the thickness of the copper layer on the ceramic layer can only be made the same extent as the ceramic layer.

As explained above, a high strength, tough ceramic layer able to withstand the future increasing thermal stress is sought. Therefore, along with silicon nitride, alumina-zirconia ceramic is promising. As explained above, however, there are limits to the control of the particle size, form, state of dispersion, and crystal structure of an alumina-zirconia ceramic formed by the sintering method. There are limits to increasing the toughness. On the other hand, the method of fabrication by the aerosol deposition method has not been established. The characteristics are not known at all. A general ceramic layer formed by the aerosol deposition method is difficult to make thicker than a sintered ceramic sheet. This is advantageous in the point of heat dissipation, but more improvement of the characteristics is required in terms of mechanical characteristics.

CITATIONS LIST

Patent Literature

PTL 1: Japanese Patent No. 3784341
PTL 2: Japanese Patent No. 4784150

Nonpatent Literature

NPL 1: Proceedings of the Annual Meeting of the Japan Society of Mechanical Engineers 2011, J031044 "Strength Degradation in Ceramic Substrate by Thermal Fatigue"
NPL 2: Ceramic, Vol. 48, 2013, No. 10 "Standardization of Methods for Thermal Fatigue Tests of Fine Ceramic Substrates"

SUMMARY

Technical Problem

The present invention has as its object to provide a ceramic laminate improving the mechanical characteristics of a composite ceramic layer which has excellent thermal fatigue resistance, thermal conductivity, and insulation ability and having excellent durability and heat dissipation and a ceramic insulating substrate and a method of production of the ceramic laminate.

Solution to Problem

The present invention adopts the following means:
(1) A ceramic laminate comprised of a base member layer on a partial or an entire surface of which a composite ceramic layer containing an alumina phase and a zirconia phase is covered, the ceramic laminate having, at any cross-section perpendicular to bonding interfaces of the composite ceramic layer and the base member layer, a structure of a first phase comprised of either of the alumina phase or the zirconia phase in which second phase particles comprised of the other of the zirconia phase or the alumina phase with a smaller total area ratio than the first phase are dispersed, and having, when measuring the second phase particles with circle equivalent diameters of 0.01 µm or more in the cross-section and voids, a maximum value of the circle equivalent diameters of the second phase particles of 5 µm or less, an average value of the circle equivalent diameters of the second phase particles of 0.02 µm to 0.3 µm, an average value of the values of long axes of equivalent ellipses when viewing the second phase particles as ellipses divided by the short axes of 2 to 10, and an area ratio of voids of 5% or less.
(2) The ceramic laminate according to (1), wherein, when an angle formed by a planar direction of the bonding interfaces closest in distance to a center of gravity of a second phase particle and the direction of a long axis of an equivalent ellipse of the second phase particle is expressed as an angle of −90° to 90° and an absolute value of the angle is defined as an orientation angle of the second phase particle, at any cross-section, 60% or more of the number of the second phase particles have orientation angles of 30° or less, and an average orientation angle obtained by dividing a total of the orientation angles by the total number of particles of the second phase particles is 5° to 35°.
(3) The ceramic laminate according to (1) or (2), wherein the base member layer is mainly comprised of copper or aluminum, and the composite ceramic layer has a thickness in a direction vertical to the base member layer of 5 µm to 200 µm.

(4) The ceramic laminate according to any one of (1) to (3), wherein the first phase is an alumina phase and the second phase is a zirconia phase.

(5) The ceramic laminate according to any one of (1) to (4), wherein the zirconia phase includes at least tetragonal crystals and the content of yttrium is 0.1 mass % or less.

(6) A ceramic insulating substrate comprised of a ceramic laminate according to any one of (1) to (5).

(7) The ceramic insulating substrate according to (6), wherein the base member layer is copper or aluminum, and a copper or aluminum circuit is formed on the opposite surface across the composite ceramic layer.

(8) The insulating substrate according to (7), wherein the thickness of the base member layer is over 0.5 mm and two times or more the thickness of the circuit.

(9) A method of production of a ceramic laminate comprising mixing alumina feedstock particles and zirconia feedstock particles with a gas and spraying the alumina feedstock particles and the zirconia feedstock particles together with the gas toward the surface of the base member layer to make them strike it and thereby form a composite ceramic layer on the surface of the base member layer.

(10) The method of production of a ceramic laminate according to (9), further comprising mixing the alumina feedstock particles with the gas to produce one aerosol and mixing the zirconia feedstock particles with the gas to produce another aerosol and spraying the one aerosol and the other aerosol toward the surface of the base member layer.

(11) The method of production of a ceramic laminate according to (9), further comprising mixing the alumina feedstock particles and the zirconia feedstock particles, mixing the gas with the mixed feedstock powder to produce an aerosol, and spraying the aerosol toward the surface of the base member layer.

(12) The method of production of a ceramic laminate according to any one of (9) to (11) wherein the zirconia feedstock is an electrically fused powder.

Advantageous Effects of Invention

By adopting the structure of the present invention, a ceramic laminate having a composite ceramic layer having excellent thermal fatigue resistance, thermal conductivity, and insulation ability increased in fracture toughness value and breakdown electric field value, having high mechanical, thermal, and electric durability, and formed integrally with the base member layer can be realized.

In a ceramic insulating substrate often bonded with a base member layer comprised of copper or aluminum, which is greatly different in coefficient of thermal expansion from the composite ceramic layer, improvement of the mechanical characteristics of the composite ceramic layer has the effect of raising the durability with respect to thermal stress due to the repeated thermal cycle.

Further, due to the structure of the composite ceramic layer like the present invention, excellent mechanical characteristics and breakdown electric field value are obtained, so even if reducing the thickness of the composite ceramic layer, there are the effects that the required dielectric breakdown voltage and mechanical fracture resistance are obtained and the heat dissipation ability is improved.

Further, by using the aerosol deposition method to bond a composite ceramic layer to a base member layer at ordinary temperature, even with a composite ceramic layer and a large coefficient of thermal expansion base member layer, the residual thermal stress at the bonding interfaces of the composite ceramic layer and base member layer can be kept smaller than the conventional method of bonding a composite ceramic layer and base member layer using a high heat. Furthermore, the compressive stress field formed inside the composite ceramic layer has the effect of suppressing fracture occurring at the ceramic side of the end of the metal circuit near the bonding interfaces of the base member layer and composite ceramic layer due to superposition of the residual tensile stress generated at the time of bonding and the thermal and mechanical stress received at the time of use—which has been becoming a problem in conventional ceramic insulating circuit boards.

Furthermore, due to the small bonding thermal stress, there is no limit on the thickness of the base member layer due to thermal stress. By making the base member layer thicker, it is possible to give the base member layer itself the functions of a heat sink and heat spreader. For example, when using the ceramic laminate of the present invention for an insulating circuit board, it is possible to use the base member layer as a heat sink and heat spreader and freely set the thickness of the electroconductive circuits provided at the opposite side across the base member layer and composite ceramic layer.

DESCRIPTION OF EMBODIMENTS

Definition of Terms

The observed surface for evaluating and defining the structure of the composite ceramic layer of the alumina-zirconia ceramic in the present invention is made a cross-section vertical to the bonding interfaces of the base member layer and the composite ceramic layer. In the case of a ceramic laminate comprised of a base member layer of the structure of a conveyor or rolling roll or other columnar or cylindrical shape on the peripheral surface of which a composite ceramic layer is formed, the cross-section vertical to the bonding interfaces of the base member layer and the composite ceramic layer for evaluating and defining the structure of the composite ceramic layer is any cross-section on a plane passing through the center axis of the column or cylinder. In this case, at the cross-section of the observed surface of the present invention on the plane passing through the center axis of the column or cylinder, the line at which the cross-section and the bonding interfaces intersect becomes a straight line.

In the present invention, the size of a second phase particle in the composite ceramic layer is expressed as the diameter of a circle having the same area as the second phase particle, that is, the circle equivalent diameter. In a structure where a large number of second phase particles are dispersed, the average particle size, defined as the average size of the second phase particles of the present invention, is the average value of the total of the diameters of the second phase particles calculated from the areas of the separated second phase particles divided by the total number of particles of the second phase particles (total number of particles).

Figure 1:
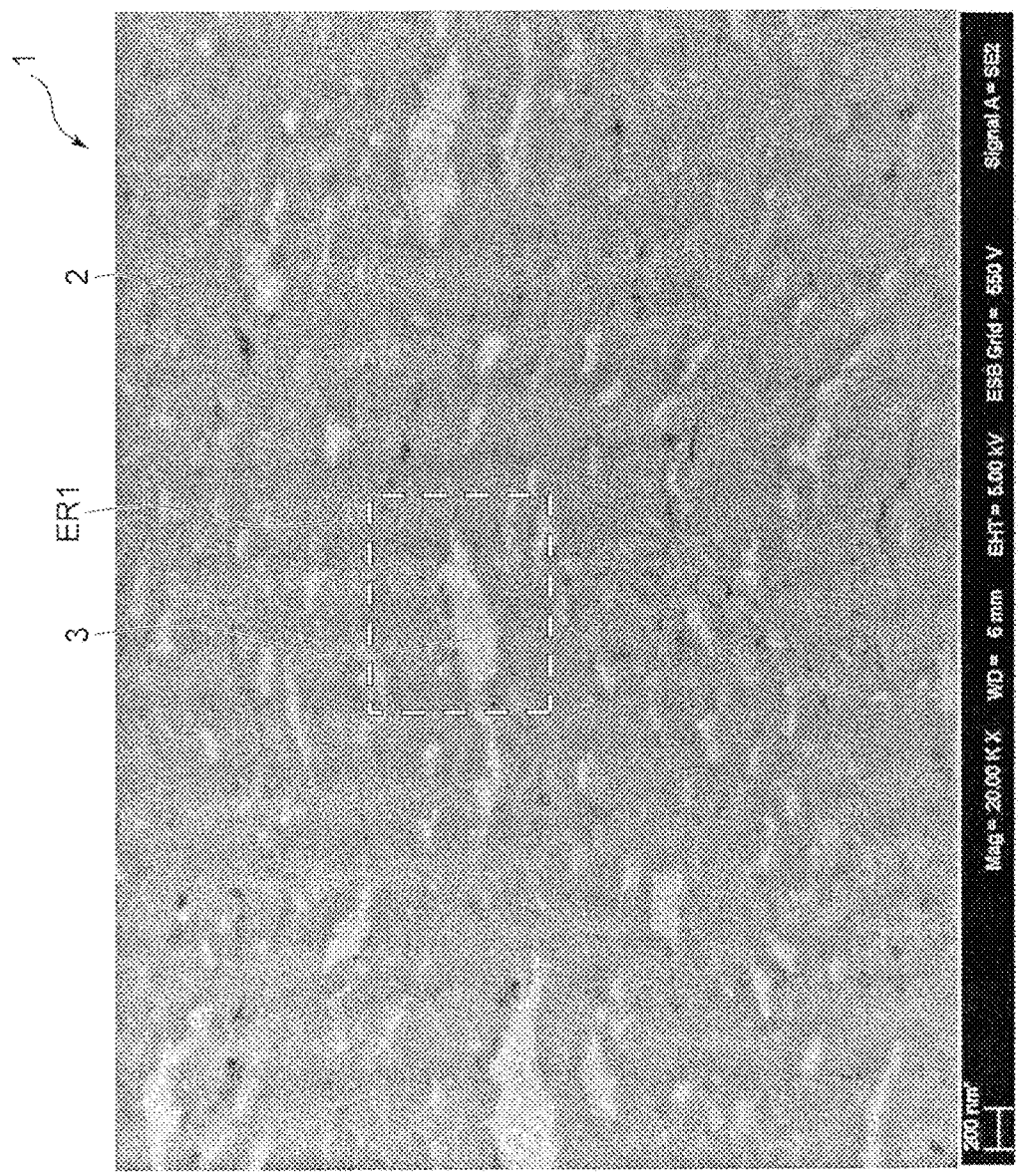
FIG. 1 is a backscattered electron image showing second phase particles observed under a field emission type scan electron microscope.

FIG. 1 is a secondary electron image when observing by a field emission type scan electron microscope a composite ceramic layer 1 having a structure comprised of a first phase 2 in which particle-shaped second phase particles 3 having a total area ratio smaller than this first phase 2 are dispersed. The ceramic laminate of the present invention is configured as a not shown base member layer over a partial or entire surface of which a composite ceramic layer 1 comprised of an alumina phase and a zirconia phase is covered.

The second phase particles 3 defined in the present invention are formed flattened in cross-section perpendicular to the bonding interfaces of the base member layer and composite ceramic layer (vertical cross-section), so the form of one second phase particle 3 was analyzed replaced with an equivalent ellipse. Here, an "equivalent ellipse" means the ellipse with zero-order, primary, and secondary moments matching the cross-section of the second phase particles covered. That is, an "equivalent ellipse" is an approximate form having the same area and center of gravity as the cross-section of the second phase particle covered and quantifying the long axis and short axis directions and the aspect ratio.

Figure 2:
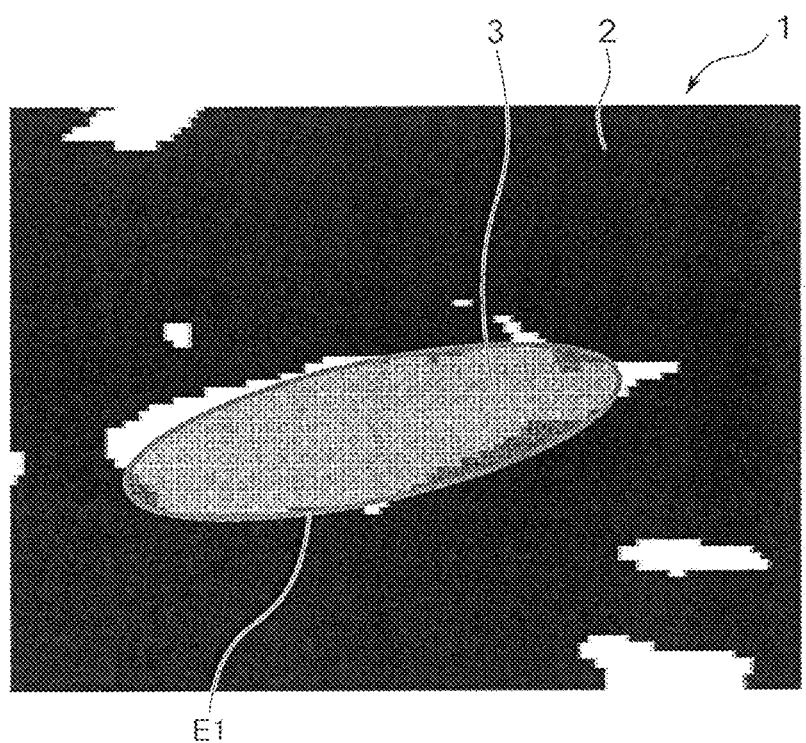
FIG. 2 is a schematic view showing an equivalent ellipse when deeming a second phase particle as an ellipse.

For example, if focusing on the second phase particles 3 in the region ER1 in FIG. 1, as shown in FIG. 2, the second phase particles 3 are formed into particle shapes having large and small relief shapes on the surfaces and having irregular outer shapes. The equivalent ellipse E1 when viewing such a second phase particle 3 as an ellipse has the same area and center of gravity as the second phase particle 3. The direction of the long axis of the equivalent ellipse E1 is defined as the direction of the long axis of the second phase particle 3 and the direction of the short axis of the equivalent ellipse E1 is defined as the direction of the short axis of the second phase particle 3. Further, the aspect ratio of the equivalent ellipse E1 is defined as the aspect ratio of the second phase particle 3

The "average of the ratios of the long axes and short axes of second phase particles 3 showing the aspect ratios of the second phase particles 3 of the present invention" is the average value of the total of the ratios of the long axes (below, also referred to as the "equivalent ellipse long axes") and short axes (below, also referred to as the "equivalent ellipse short axes") of the equivalent ellipses E1 of the second phase particles 3 divided by the total number of particles of the second phase particles 3.

Figure 3:
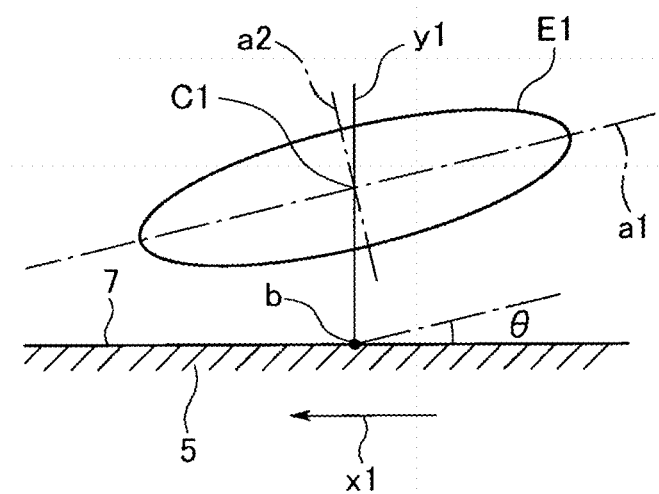
FIG. 3 is a schematic view used for explaining an orientation angle.

In the present invention, the orientation angle is used to express the orientation of an equivalent ellipse E1 with respect to the bonding interfaces of the composite ceramic layer and the base member layer. Regarding the "orientation angle", as shown in FIG. 3, when the angle θ formed by the planar direction x1 of the bonding interfaces 7 at the point "b" of the bonding interfaces 7 closest in distance to a center of gravity C1 of a second phase particle 3 and the direction a1 of the equivalent ellipse long axis of the second phase particle 3 (below, also referred to as the "equivalent ellipse long axis direction") is expressed as an angle of −90° to 90°, an absolute value of the angle is made the orientation angle of the second phase particle 3. More specifically, the "planar direction x1" means the planar direction of the bonding interfaces 7 perpendicularly intersecting the line y1 connecting the point "b" on the bonding interfaces 7 closest to a center of gravity C1 of a second phase particle 3 and the center of gravity C1 of the second phase particle 3 at the point "b" of the bonding interfaces 7. Note that "a2" in FIG. 3 shows the direction of the equivalent ellipse short axis perpendicularly intersecting the equivalent ellipse long axis direction a1 (below, also referred to as the "equivalent ellipse short axis direction").

The angle θ formed by the planar direction x1 extending from the point "b" of the bonding interfaces 7 closest in distance to a center of gravity C1 of a second phase particle 3 and the equivalent ellipse long axis direction a1 is not indicated by 360°, but is indicated by ±180° about 0°. The value of ±90° is taken from the symmetry of the equivalent ellipse E1. In the present invention, the absolute value of this angle is defined as the orientation angle of the second phase particle. That is, in the cross-section defined in the present invention, if the equivalent ellipse expressing a second phase particle is at repose with respect to the line at the bonding interfaces of the composite ceramic layer and the base member layer, the average orientation angle is 0° to less than 45°, while if the second phase particle is upright, it is a value of over 45° to 90°.

The average orientation angle is the average value of the total of the orientation angles of the individual second phase particles 3 in any cross-section divided by the total number of particles of the second phase particles 3 in that cross-section. If second phase particles 3 with an aspect ratio greater than 1 face completely random directions, the average orientation angle takes a value of 45°.

Regarding Ceramic Laminate of Present Invention

The present invention is a ceramic laminate comprised of a base member layer on a partial or entire surface of which a composite ceramic layer comprised of an alumina phase and zirconia phase and having a specific structure is covered. In the structure, the zirconia phase is dispersed in the alumina phase or the alumina phase is dispersed in the zirconia phase. The ratio of the two does not matter. In the present invention, in any cross-section, the phase with a large total area ratio is defined as the first phase and the phase with a total area ratio smaller than the first phase and formed into a particle shape is defined as the second phase particles. The main strengthening and toughening mechanism of the composite ceramic layer comprised of the alumina-zirconia ceramic (composite ceramic) is a mechanism inhibiting crack progression due to the spatial distribution of the stress field resulting from the mixture of the two phases (first phase and second phase particles). This stress field is created by the internal stress and thermal stress when forming the composite ceramic layer due to the differences in elastic moduli and coefficients of thermal expansion of the two particles.

The required ratio of second phase particles differs depending on the particle size and degree of distribution, but an area ratio of any cross-section of 1% or more is sufficient. Further, if the area ratio of the first phase and second phase particles in the composite ceramic layer is 3% or more, the effect of suppression of crack progression becomes greater. 10% or more is more preferable. Theoretically, the area of the particles dispersed in the matrix could become larger than the area of the matrix, but in actuality, the area of the particles dispersed is smaller than the area of the matrix. The area ratio of the first phase and second phase particles in the composite ceramic layer preferably has an upper limit of 40% or less, more preferably 33% or less.

Further, an "alumina phase" indicates a phase mainly comprised of alumina. In this Description, the alumina content may be 90 mass % or more, 92 mass % or more, 94 mass % or more, 96 mass % or more, or 98 mass % or more. A "zirconia phase" indicates a phase mainly comprised of zirconia. In this Description, the zirconia content may be 90 mass % or more, 92 mass % or more, 94 mass % or more, 96 mass % or more, or 98 mass % or more.

In the present invention, to give the alumina-zirconia ceramic excellent mechanical characteristics, compared with a generally produced alumina-zirconia ceramic sintered body, the particle size of the second phase particles is small and the form of the second phase particles also greatly differs. In the composite ceramic layer of the present invention, at any cross-section perpendicular to the base member layer, among the alumina phase and the zirconia phase, the one with the smaller total area ratio than the first phase is made the second phase particles. The second phase particles of a circle equivalent diameter of the particles of 0.01 μm to 1 μm account for almost the entire area ratio of the second phase particles. When measuring the second phase particles with circle equivalent diameters of 0.01 μm or more, it is required that the average size of the second phase particles be 0.02 μm to 0.3 μm and the average value of the long/short axis ratios of the long axes of the equivalent ellipses of the second phase particles divided by the short axes be 2 to 10. (Below, unless otherwise indicated, the "circle equivalent diameter of the second phase particles" is the value when measuring second phase particles with circle equivalent diameters of 0.01 μm or more.) By adopting such a structure, it is possible to improve the strength and fracture toughness value and improve the breakdown electric field value. In particular, the effect of inhibiting crack progression in the direction vertical to the bonding interfaces of the base member layer and the composite ceramic layer, that is, the film thickness direction of the composite ceramic layer, and improving the breakdown electric field value becomes greater. Due to this, for example, when forming a ceramic laminate comprised of a base member layer of the structure of a conveyor or rolling roll or other columnar or cylindrical shape on the peripheral surface of which a composite ceramic layer is formed, a conveyor roll excellent in wear resistance can be constructed. When applied to a ceramic insulating substrate, it is possible to improve the thermal cycle resistance and the thickness of the insulating film can be made smaller, so it is possible to construct a ceramic insulating substrate excellent in heat dissipation ability.

The alumina-zirconia ceramic of the composite ceramic layer of the present invention has a particle size of the second phase particles one order or so smaller than a general alumina-zirconia ceramic sintered body. By making the average particle size 0.3 μm or less, the number of regions generating stress fields formed around the second phase particles increases, the opportunities for a crack to bypass the second phase particles when the crack progresses increase; and crack progression can be inhibited. The size of the second phase particles has the action of suppressing crack progression up to several μm, but if the maximum size exceeds 5 μm, the frequency of formation of the relatively large cracks or voids in the surrounding first phase increases and the mechanical characteristics deteriorate. For this reason, the maximum size of the second phase particles is preferably 5 μm or less, more preferably 1.5 μm or less, still more preferably less than 1 μm. On the other hand, in the composite ceramic layer in the ceramic laminate of the present invention, particles with circle equivalent diameters of 0.01 μm or less may be contained, but if the average size of the second phase particles is smaller than 0.02 μm, the action of inhibiting crack progression becomes smaller. In particular, the average size of the second phase particles is preferably 0.02 μm to 0.2 μm. In this case, the mechanical characteristics of the composite ceramic layer become much higher.

The crystal grain size of the first phase does not matter but if made finer to become equal to or greater than the second phase particles, the mechanical characteristics are further improved and the overall breakdown electric field value also rises. Accordingly, the crystal grain size of first phase is preferably made finer to become equal to or greater than the crystal particles in the second phase particles.

The composite ceramic layer of the present invention has second phase particles which are formed flat. The average value of the ratios of the long axes and short axes when based on the short axes of the equivalent ellipses of the second phase particles is 2 to 10. Due to this, crack progression in the short axis direction of the second layer among cracks progressing through the crystal grain boundaries is inhibited. The composite ceramic particles of the present invention generally have film thickness directions in the short axis directions, so high strength and fracture toughness can be obtained in the film thickness direction. Further, the second phase of the composite ceramic layer of the present invention does not have a long axis direction completely parallel to the in-plane direction of the film, so there is the effect of inhibiting crack progression along the crystal grain boundaries in the in-plane direction as well. Therefore, it is possible to improve the strength and fracture toughness value in all directions of the composite ceramic layer.

Further, when the second phase particles themselves are tetragonal zirconia, in particular the action of absorbing the energy due to progression of a crack tip in the equivalent ellipse long axis direction is strong, so it is possible to improve the strength and fracture toughness value.

Furthermore, when the crystal grains are flat in the film thickness direction, it is possible to improve the breakdown electric field value in the film thickness direction of the composite ceramic layer determining the insulation characteristic of the ceramic laminate.

In the composite ceramic layer in the ceramic laminate of the present invention, the voids also affect the mechanical characteristics and electrical characteristics. Suitable presence of voids sometimes is preferable from the viewpoint of the fracture toughness, but from the viewpoints of the strength and insulation ability, the smaller the number the more desirable. In the present invention, in the cross-section defined by the present invention, it is required that the area ratio of the voids be 5% or less. The ratio is preferably 3% or less, more preferably 0.7% or less.

Method of Measuring Structure

The ceramic laminate of the present invention is comprised of a base member layer on which a composite ceramic layer comprised of an alumina phase and zirconia phase and having a specific structure is covered. As explained above, the structure of the alumina-zirconia ceramic (composite ceramic) has anisotropy with respect to the bonding interfaces of the base member layer and the composite ceramic layer. For this reason, the observed surface for evaluating and defining the structure of the composite ceramic layer of the alumina-zirconia ceramic in the present invention is made the cross-section vertical to the bonding interfaces of the base member layer and the composite ceramic layer. That is, in the case of a ceramic laminate comprised of a base member layer of the structure of a conveyor or rolling roll or other columnar or cylindrical shape on the peripheral surface of which a composite ceramic layer is formed, the observed surface for evaluating and defining the structure of the composite ceramic layer (the cross-section vertical to the bonding interfaces of the base member layer and the composite ceramic layer) is any cross-section on a plane passing through the center axis of the column or cylinder. In this case, at the cross-section of the observed surface of the present invention vertical to the bonding interfaces, the bonding interfaces become a straight line rather than a curve.

The method of evaluating the form of the second phase particles of the composite ceramic layer of the present invention does not matter, but the second phase particles forming the structure of the present invention are smaller than the particles in a conventional sintered body, so a method of evaluation able to detect particles with circle equivalent diameters of 0.01 µm or more is necessary. Further, the mechanical and electrical characteristics of the composite ceramic layer in the ceramic laminate of the present invention are improved by particles of 0.01 µm or more, so the method of evaluation should be one able to detect particles with circle equivalent diameters of 0.01 µm or more. One method satisfying this is the increasingly applied method of analyzing a backscattered electron image or secondary electron image of a field emission type scan electron microscope (FE-SEM). This has become the standard method of evaluation of the structure of the present invention.

Alumina and zirconia greatly differ in mass number, so these phases can be separated relatively easily as a difference in contrast of the backscattered electron or secondary electron image of a scan electron microscope. If using an FE-SEM and raising the acceleration voltage to 5 kV and the magnification to 20000×, a resolution of about 0.01 µm can be easily obtained. If the acceleration voltage is large, there is a possibility that not only the phases exposed at the surface, but also the inside phases will be picked up as contrast. Therefore, the composite ceramic layer of the present invention is preferably evaluated by using an image obtained by an acceleration voltage of 5 kV or less.

The image obtained by such conditions may be binarized for analysis of the form. However, at the observed surface of the composite ceramic layer of the present invention, sometimes particles with a long axis of over 1 µm are also included, so in a 20000× field, sometimes one field is too small to obtain the average information of the material. As a metric, it is necessary to obtain a plurality of images in not overlapping fields so that the second phase particles become 1000 or more and analyze the form.

The area of the second phase particles can be specified by obtaining an image of a cross-section of the composite ceramic layer from the above-mentioned backscattered electron image or secondary electron image of a field emission type scan electron microscope (FE-SEM), visually extracting the region of the cross-section of the second phase particles based on this cross-sectional image, and calculating the area inside the extracted region using image analyzing software. In the present invention, it is possible to specify the areas and forms of the second phase particles from the cross-sectional image of the composite ceramic layer used as the observed surface and use the same to specify the average size of the second phase particles and the equivalent ellipse long axes, equivalent ellipse short axes, and aspect ratios of the second phase particles etc.

Further, in the case of the composite ceramic of the present invention, the voids can also be easily discerned as contrast by a scan type electron microscope, so it is possible to use the image used for evaluation of the second phase particles to binarize only the voids and evaluate the area ratio and sizes.

Regarding Orientation Angle of Second Phase Particles

The present invention is characterized by the distribution of "the second phase particles having an aspect ratio of an average of 2 or more" with respect to the base member layer. Due to this, the insulation resistance value and the fracture toughness value of the ceramic laminate can be improved. In the ceramic laminate of the present invention, the bonding interfaces of the base member layer and the composite ceramic layer do not have to be a flat plate shape such as in the case where the peripheral surface of a conveyor roll is covered, but the orientation of the second phase particles of the present invention preferably is characterized as follows: In the ceramic laminate of the present invention, in a cross-section vertical to the bonding interfaces of the base member layer and the composite ceramic layer, if comparing the angle θ formed by the direction a1 of the equivalent ellipse long axis of a second phase particle with respect to the planar direction x1 at the point "b" of the bonding interfaces closest in distance to the center of gravity of the individual second phase particle and the angle of the complementary angle of the angle θ formed by the direction a2 of the equivalent ellipse short axis of the second phase particle, the angle θ formed by the direction a1 of the equivalent ellipse long axis is smaller than the angle formed by the direction a2 of the equivalent ellipse short axis.

That is, when the ceramic laminate is a flat plate, second phase particles are formed into flattened shapes which are small in particle size in the direction vertical to the bonding interfaces of the base member layer and the composite ceramic layer and which are large in particle size in the direction parallel to the bonding interfaces. Specifically, when the angle θ formed by the planar direction x1 at the point "b" of the bonding interfaces closest in distance to a center of gravity of a second phase particle and the direction a1 of the equivalent ellipse long axis of the individual second phase particle is expressed as an angle of −90° to 90° and an absolute value of the angle is defined as an orientation angle of the second phase particle, preferably 60% or more of the number of the second phase particles have orientation angles of 30° or less. By the ceramic laminate of the present invention having such a characteristic structure, the insulation resistance value in the direction vertical to bonding interfaces of the base member layer and the composite ceramic layer is improved and the strength and fracture toughness value are improved. Such a physical value of the orientation angle strongly affects the thermal, mechanical, and electrical characteristics of the ceramic insulating substrate and is effective for obtaining excellent thermal cycle resistance and breakdown voltage.

On the other hand, the second phase particles are flat with respect to a plane parallel to the bonding interfaces of the base member layer and the composite ceramic layer in the case of the present invention. Due to the second phase particles themselves, there is the action of obstructing crack progression, so the mechanical characteristics are improved compared with the first phase alone. On the other hand, when the equivalent ellipse long axis direction a1 of a second phase particle and the bonding interfaces are aligned and in the extreme case the angle θ formed by the equivalent ellipse long axis direction a1 and the bonding interfaces is 0°, the continuity of the crystal grain boundaries in the direction parallel to the bonding surface of the ceramic laminate becomes higher. In particular, the effect of suppressing crack progression along the crystal grain boundaries becomes smaller.

In the second phase particles of the present invention, in the cross-section vertical to the bonding interfaces of the base member layer and the composite ceramic layer, the equivalent ellipse long axis direction a1 and the equivalent ellipse short axis direction a2 are preferably offset by a certain extent in the direction parallel and the direction vertical to the bonding interfaces. The average orientation angle of the total of the orientation angles divided by the total number of particles of the second phase particles is preferably 5° to 35°. Further, it preferably is distributed at various angles and varies.

The individual second phase particles extracted by the secondary electron and backscattered electron images of an FE-SEM and image processing are distributed and vary by different orientation angles from 0° to 90° while the average orientation angle of the second phase particles with the bonding interfaces obtained by dividing the total of the orientation angles by the total number of particles of the second phase particles is 5° to 35°. Due to this, crack progression along the crystal grain boundaries advancing over a plane substantially parallel to the bonding interfaces is bent in direction by the second phase particles and suppressed. From the same theory, the crystal grains of the first phase are desirably distributed in a form similar to the second phase particles.

Regarding Ceramic Insulating Substrate

The ceramic laminate of the present invention is excellent in mechanical characteristics due to the action of the flattened fine second phase particles. For example, by forming a composite ceramic layer prescribed by the present invention on the surface of the plate-shaped base member layer and bonding a composite ceramic layer with a base member layer, the effect of keeping cracks from progressing in the direction vertical to the base member layer becomes stronger. The laminate has extremely strong resistance to tensile stress in the in-plane direction parallel to the bonding interfaces. Further, the first phase crystal grains and second phase particles are fine, so the dielectric breakdown electric field is also high. Therefore, in the present invention, it is possible to make the thickness of the composite ceramic layer thinner and design the thermal conductivity in the direction vertical to the base member layer higher.

Such a characteristic is useful for a ceramic insulating substrate, so the ceramic laminate of the present invention is particularly suitable for a ceramic insulating substrate. In particular, a thermal cycle resistance with respect to a thermal cycle broader at the lower temperature side or higher temperature side than the conventional temperature range of a thermal cycle test of −40° C. to 125° C. had been a level difficult to achieve with a conventional ceramic insulating substrate, but the ceramic laminate according to the present invention has a thermal cycle resistance to such a thermal cycle. Therefore, the ceramic laminate of the present invention can also be used as a ceramic insulating substrate for next generation vehicle use used in harsh temperature environments.

A "ceramic insulating substrate" is a substrate given an electrical insulation ability by a ceramic layer. The ceramic insulating substrate of the present invention preferably has an insulating layer of a composite ceramic layer comprised of an alumina-zirconia ceramic of the above-mentioned characterizing structure and has a base member layer of mainly copper or aluminum able to transmit heat or electricity. Note that the "mainly" here means containing copper or aluminum in 50 mass % or more based on the mass of the composition forming the base member layer as a whole. That is, from the viewpoint of the thermal conductivity or electrical conductivity, the copper or aluminum is desirably pure copper or pure aluminum with few impurities, but in terms of strength or for other reasons, the base member layer may be mainly comprised of copper or aluminum and contain a balance of another metal besides copper and aluminum to an extent where the thermal conductivity and electrical conductivity are not significantly impaired. However, diamond is small in bonding strength with a ceramic layer, so it is preferably not exposed at the surface at which the ceramic layer is formed.

The ceramic insulating substrate of the present invention is thin in thickness of the composite ceramic layer and is not restricted in thickness of the base member layer, so has an excellent heat dissipating function as a circuit substrate, heat sink, or heat spreader. In a conventional ceramic insulating circuit board, a sintered body of a thickness of 0.2 mm to 0.6 mm obtained by sintering a ceramic material formed into a sheet shape by the doctor blade method or roll compaction method at 1300° C. or more is used, but in the ceramic insulating substrate of the present invention, the thickness of the composite ceramic layer can be made thinner than the thickness of the sintered body. Here, to give a thermal conductivity better than a conventional sintered body (ceramic insulating circuit board), the composite ceramic layer having excellent mechanical characteristics and insulation characteristics of the present invention preferably has a thickness in the direction vertical to the base member layer of 200 μm or less, more preferably 100 μm or less. Further, the composite ceramic layer preferably has a thickness in the direction vertical to the base member layer of 5 μm or more from the viewpoint of securing the insulation ability and from the value of the maximum size of the second phase particles of the present invention.

In the ceramic insulating substrate of the present invention, when providing one side with an electric circuit for mounting a semiconductor chip and providing the other opposite side with a heat sink or heat spreader aimed at heat dissipation, since the base member layer of the present invention is not limited in thickness or form compared with the conventional method, it is preferably made the side where the heat sink or heat spreader is arranged. Further, as explained later, the base member layer can also be made the heat sink or heat spreader as it is. Furthermore, an electrical circuit more easily exhibits the effect of the present invention if forming a composite ceramic layer, then forming a copper or aluminum layer.

The method of forming a film on another surface such as the above circuit after forming the ceramic laminate of the present invention does not matter, but the later explained "aerosol deposition method (AD method) or cold spray method" or other such kinetic deposition method, a method classified as an impact solidification method or else the plating method, thermal spray method, or a method combining these may be mentioned.

In a conventional ceramic insulating circuit board, the thermal stress arising due to the difference in thermal expansion between copper and a ceramic caused at the time of bonding the base member layer and ceramic layer becomes extremely large. For this reason, in the past, the thickness of the copper base member layer was limited. For example, when the thickness of the ceramic layer was 0.2 mm to 0.6 mm, it was difficult to bond the ceramic layer to a base member layer of 0.5 mm or more. Therefore, when using the copper side of the base member layer as a heat sink or heat spreader and making a large amount of heat dissipate, it is necessary to use a low melting point metal braze etc. to bond a structure having a high heat conductivity and high heat dissipation ability to the base member layer of the composite ceramic laminate. As opposed to this, in the ceramic insulating substrate of the present invention, when using a metal sheet such as copper as the base member layer, the thickness of the base member layer can, for example, be made thicker such as 10 mm. Note that in this case as well, to raise the heat dissipation ability, the surface of the base member layer may be covered by another substance. Further, the surface of the base member layer may be given relief shapes or the surface of the base member layer may be made fin-shaped.

In a conventional ceramic insulating circuit board, the thermal stress generated from the difference in thermal expansion between the copper and ceramic occurring when bonding the base member layer and the ceramic layer becomes extremely large. For this reason, in the past, there were limits to the thickness or balance of the insulated ceramic substrate. For example, when the thickness of the insulated ceramic substrate is 0.2 mm to 0.6 mm, if bonding a metal sheet to just one side, the thermal stress ends up causing warping. Therefore, it was necessary to bond metals of substantially the same thicknesses to both sides of insulated ceramic substrate to balance them. For example, when forming an insulating, heat dissipating circuit board, if bonding copper of 0.3 mm as a heat sink, it was necessary to form a copper circuit of about 0.3 mm on the circuit side as well. As opposed to this, by using the ceramic laminate of the present invention, it is possible to use over 0.5 mm of copper at the base member layer and form a copper circuit of ½ or less of the base member layer as the insulating ceramic side. For example, a configuration making the thickness of the base member layer at the heat sink side thicker to 1 mm or more, making the thickness of the circuit side thinner to 0.5 mm or less, and making the difference in thicknesses of the copper sheets at the two sides 0.2 mm or more is possible. Of course, depending on the amount of current run through the circuit, the thickness of the circuit side may be made greater as well. In this case, the method of formation of the metal circuit provided at the ceramic laminate of the present invention is preferably a method in which large heat is not applied. The aerosol deposition method is suitable. Further, to increase the thickness, the cold spray or plating method may be combined with it.

The coefficient of thermal expansion becomes larger in the order of alumina, zirconia, copper, and aluminum. For this reason, when making the base member layer an insulating heat dissipating substrate formed by pure copper or pure aluminum, by making the composite ceramic layer a form comprised of an alumina phase in which a zirconia phase is dispersed, it is possible to make the macroscopic coefficient of thermal expansion of the composite ceramic layer close to the coefficient of thermal expansion of copper or aluminum. Accordingly, such a ceramic insulating substrate (ceramic laminate) is smaller in thermal strain and thermal stress with respect to a repeated thermal cycle compared with a ceramic of a single alumina phase and better in mechanical characteristics, so fatigue fracture becomes harder to occur. Further, in the case of a composite ceramic layer comprised of a zirconia phase in which an alumina phase is dispersed, the thermal conductivity rate is better in the alumina phase compared with the zirconia phase, so the heat dissipation ability is also improved over a ceramic of a single zirconia phase.

Method of Production

The method of production of the ceramic laminate of the present invention comprised of a base member layer on a partial or entire surface of which a composite ceramic layer comprised of an alumina phase and zirconia phase is covered is not limited, but, for example, it is preferable to use the aerosol deposition method (AD method) of mixing the alumina feedstock particles and zirconia feedstock particles with a gas, spraying the alumina feedstock particles and zirconia feedstock particles together with the gas toward the surface of the base member layer to make them strike it, and forming a composite ceramic layer on the surface of the base member layer. At that time, by controlling the feedstock powder (powder comprised of alumina feedstock particles and zirconia feedstock particles) and the process conditions, it is possible to obtain the ceramic laminate of the present invention.

As the process requirements when using the AD method, it is necessary to be able to form a dense film on the surface of the base member layer by a composition close to the mixed composition of alumina and zirconia at the feedstock powder comprised of the alumina feedstock particles and zirconia feedstock particles. For this reason, while not limited to a specific single condition, it is necessary to intensively study the conditions for satisfying the above requirements. For example, unless both a powder comprised of the alumina feedstock particles (also referred to as the "alumina feedstock powder") and a powder comprised of the zirconia feedstock particles (also referred to as the "zirconia feedstock powder") are deposited well, a densely dispersed composite ceramic layer cannot be obtained. Further, if the film composition and mixed composition greatly differ, the composition of the composite ceramic layer changes or just one component in the feedstock powder becomes missing and therefore long term stable film formation is not possible, so a large area, large thickness composite ceramic layer cannot be obtained. From such a viewpoint, to obtain a good composite ceramic layer, which is much more difficult than when forming a single phase film by the AD method, it is necessary to use the component phases of the ceramic laminate and their combinations to individually study the form of the feedstock powder etc.

Note that, as the method of production of a ceramic laminate of the present invention, the method of production may be one individually forming an aerosol comprised of alumina feedstock particles mixed with a gas and an aerosol comprised of zirconia feedstock particles mixed with a gas, simultaneously spraying the two aerosols from separate nozzles to make the aerosols strike the surface of the base member layer, and forming a composite ceramic layer on the surface of the base member layer. Further, as another method of production, the method of production may also be one mixing alumina feedstock particles and zirconia feedstock particles in advance by a predetermined composition, mixing a gas with the obtained mixed feedstock powder to produce an aerosol of the mixed feedstock powder, spraying the aerosol of the mixed feedstock powder from a single nozzle toward the surface of the base member layer to make it strike it, and forming a composite ceramic layer on the surface of the base member layer.

In the case of the latter method of production, regardless of fact that the specific gravity of zirconia is larger than alumina, it is desirable to use a powder where the particle size of the zirconia feedstock particles is larger than the particle size of the alumina feedstock particles. As the alumina feedstock particles, it is desirable to use particles with a median size of 1 µm or less. For the zirconia powder, there are the method of production by a chemical technique using the hydrolysis process and the method of production by crushing an electrically fused body. With the former, fine, uniform primary particles are easily obtained, but when forming the alumina-zirconia layer of the present invention, using the latter as a feedstock enables a desirable structure of the present invention to be easily obtained and enables a denser structure to be easily obtained, so this is preferable. These alumina feedstock particles and zirconia feedstock particles are mixed by a ball mill to uniformly mix them, but, in consideration of crushing at this time, it is necessary to determine the particle sizes and mixing conditions of the alumina feedstock particles and zirconia feedstock particles.

As the gas forming the aerosol, nitrogen gas or helium, argon, or other inert gases may be mentioned. Helium gas is light, so to raise the speed of spraying the aerosol, the process window such as the ranges of particle sizes of the alumina feedstock particles and zirconia feedstock particles able to form a film become broader, but if considering the cost, the use of nitrogen gas is preferable.

The optimum film forming conditions depend on the sizes of the feedstocks. While not particularly limited, in the case of an alumina-zirconia mixed powder with a size of the feedstock particles in the range of 0.1 µm to 10 µm, if adjusting the flow rate of the film forming gases to a range of the differential pressure between the inlet and outlet of the spray nozzle of 20 kPa or more, the flow rate of the gas passing through the nozzle of 50 to 800 m/s, and the pressure of the film forming chamber of 50 Pa to 500 Pa in range, the result is obtained of satisfying the provision of the average size of the second phase particles of the present invention (0.02 µm to 0.3 µm). In the ranges of sizes of the feedstock particles of this alumina-zirconia mixed powder, when using nitrogen gas as the gas forming the aerosol, it is preferable to make the flow rate the lower limit (50 m/s) side. On the other hand, when using helium gas, it is preferable to make the flow rate the upper limit (800 m/s) side. If the flow rate of the gas passing through the nozzle is too small, the kinetic energy of the particles is small and no film is formed. On the other hand, if the flow rate of the gas passing through the nozzle is too large, the feedstock particles end up fracturing the base member layer and no film is formed. Further, even if the flow rate of the gas passing through the nozzle is in the film forming range, the density of the film and the average orientation angle change. The average orientation angle tends to become smaller the larger the speed of the particles in the aerosol, so within the range where a dense film can be formed, the smaller the flow rate of film forming gas and the larger the pressure of the film forming chamber, the more the desirable range of the average orientation angle of the present invention (5° to 35°) can be obtained. Further, if the aspect ratio of the feedstock particles is small, the average orientation angle tends to become smaller.

When forming a composite ceramic layer on a flat surface by the aerosol deposition method, there are (i) the method of using a nozzle of the same nozzle width as the film forming width and making the nozzle or base member layer (workpiece) move back and forth by the film forming width in a direction vertical to the nozzle width along the film forming surface of the base member layer and (ii) the method of using a nozzle of a smaller nozzle width than the film forming width and conveying the nozzle or workpiece in a lateral direction perpendicular to the direction of back and forth motion (also referred to as the film forming surface length direction) while forming the film in the process of the nozzle or base member layer moving back and forth along the film forming surface of the base member layer. In the case of the latter method (ii), the smaller the amount of conveyance in the lateral direction (pitch) when the position of the nozzle moving back and forth with respect to the workpiece returns to the initial coordinate position in the length direction of the film forming surface, the more uniform the film thickness obtained. With a pitch of 2 mm or less, the average orientation angle prescribed in the present invention is easily obtained.

On the other hand, when forming a composite ceramic layer on the peripheral surface of a columnar or cylindrical base member layer (workpiece), the workpiece is made to rotate about its center axis while forming the composite ceramic layer. At this time, in the same way as the case of forming a film on a flat surface, there are (i) the method of using a nozzle of the same nozzle width as the film forming width and forming the film while fixing the nozzle in place and (ii) the method of using a nozzle of a nozzle width smaller than the film forming width and conveying the nozzle in the width direction (axial direction) in the state parallel to the center axis of the workpiece while reversing the conveyance at the end of the film forming surface in the width direction to return the nozzle and form a film at the peripheral surface. In the case of the latter method (ii), the smaller the amount of conveyance (pitch) when the workpiece rotates one time, the more uniform a film thickness is obtained. If the pitch is 2 mm or less, the average orientation angle prescribed in the present invention is easy to obtain.

Others

When using the AD method to form a dense composite ceramic layer, sometimes a compression field is formed at just the first phase or at both the first phase and second phase particles. The size of such a compression field can become a compressive stress of 100 MPa to several GPa in at least the in-plane direction. The elastic moduli of alumina and zirconia differ, so it is expected that the stress field will change microscopically. As a result, the effect arises of inhibiting crack progression.

In a conventional ceramic insulating circuit board, due to bonding the ceramic layer and the base member layer comprised of copper or another metal at a high temperature, there is the problem that residual thermal stress ends up occurring due to the difference in coefficients of thermal expansion of the ceramic layer and the base member layer leading to the ceramic layer fracturing. Further, in the past, thermal stress was applied due to the process of mounting the semiconductor or peripheral devices on the ceramic insulating circuit board or repeated thermal cycle at the time of use, resulting in the problem of the ceramic layer fracturing.

In particular, at the ceramic side of the end of the metal circuit near the bonding interfaces of the metal base member layer and the ceramic layer, the residual tensile stress generated at the time of bonding and the thermal and mechanical stress received at the time of use are superposed often leading to the ceramic layer fracturing. If the tensile residual stress generated at the end of the copper sheet at the bonding interfaces of the ceramic layer and the stress due to the thermal cycle are added, it is calculated that a tensile stress of several 100 MPa will be reached. The compressive stress in the in-plane direction remaining in the composite ceramic layer of the present invention can be expected to ease the stress fracturing such a composite ceramic layer and suppress fracture due to thermal stress due to the repeated thermal cycle at the time of use.

In the zirconia phase, monoclinic crystals are stable at room temperature, while tetragonal crystals are stable at 1170° C. to 2200° C. in which the range of sintering temperature falls and cubic crystals are stable at still higher temperatures. Therefore, if cooling down to room temperature after sintering, tetragonal crystals change to monoclinic crystals by martensitic transformation. Along with the phase transformation, a large change in volume occurs, so sometimes cracks end up forming in the zirconia phase and the mechanical strength is remarkably lowered. Therefore, in a general sintered body, to prevent this, a certain amount of yttria or calcia has to be added to stabilize the high temperature phase.

In the method of production of the ceramic laminate of the present invention, there is no sintering process, so when the usage temperature is 1170° C. or less, the crystal structure form of the zirconia phase does not matter. However, to make active use of the strengthening and toughening mechanism absorbing the energy of the crack tips by the zirconia phase changing from tetragonal crystals to monoclinic crystals by stress-induced transformation, it is necessary that at least part of the zirconia phase become tetragonal crystals at the usage temperature.

The dense composite ceramic layer prepared by the method of production of the present invention is characterized by a phase including tetragonal zirconia being formed even if using monoclinic zirconia as a feedstock. Therefore, the ceramic laminate becomes excellent in mechanical characteristics even if not containing yttria, ceria, calcia, magnesia, or another stabilizer for stabilizing the high temperature phase. This ceramic layer does not contain any stabilizer. The content of the stabilizer is basically 0% or the level of unavoidable impurities. However, if confirming the content by fluorescent X-rays or other methods of analysis, the general detection limit is 0.05 mass %. Therefore, it may be prescribed that the combined content of the yttrium and cerium in the ceramic layer used as general stabilizers be 0.1 mass % or less. The expensive yttria and ceria do not have to be intentionally included so this is advantageous costwise. Of course, due to applications of high temperature use and other reasons, the above stabilizing materials may be mixed into the composite ceramic layer to obtain a composite ceramic layer comprised of a tetragonal and high mechanical strength cubic zirconia phase and alumina phase. In this case as well, the amounts of the stabilizers of yttria and ceria can be reduced compared with the sintering method. For partial stabilization, an amount smaller than the normal sintering method, for example, 5 mass % or less, is sufficient for the feedstock zirconia.

If utilizing the stress-induced transformation of tetragonal zirconia in the ceramic film, if making the zirconia particles flat in the film thickness direction, it becomes possible to make up for the strength and toughness in the direction vertical to the film thickness, so this is preferable. Cubic zirconia itself is high in strength. Including a large amount of stabilizer and increasing the ratio of cubic zirconia is advantageous for strengthening and toughening. On the other hand, if including too much stabilizer, the amount of cubic zirconia having ion conductivity increases, so when using cubic zirconia as the first phase of the ceramic insulating substrate, the insulation ability should be paid attention to.

In the above configuration, the ceramic laminate of the present invention is structured with second phase particles of the zirconia phase or alumina phase with a smaller total area ratio than the first phase dispersed in the first phase. The maximum value of the circle equivalent diameter of the second phase particles was made 5 μm or less, the average size of the second phase particles was made 0.02 μm to 0.3 μm, the average value of the ratios of the long axes and short axes of the equivalent ellipses when viewing the second phase particles as ellipses was made 2 to 10, and the area ratio of the voids was made 5% or less. Due to this, in the present invention, a ceramic laminate and ceramic insulating substrate comprised of a composite ceramic layer having excellent thermal fatigue resistance, thermal conductivity, and insulation ability which is increased in fracture toughness value and breakdown electric field value, high in mechanical characteristics of the composite ceramic layer, and excellent in durability and heat dissipation ability and further a ceramic insulating circuit board can be realized.

EXAMPLES

Below, the present invention will be explained in detail based on examples, but this just shows examples of the present invention. The present invention is not limited in any way by these examples.

Example 1

Here, as Example 1, the aerosol deposition method is used to form a composite ceramic layer of alumina-zirconia on a copper base member layer to prepare a ceramic laminate. Further, an alumina-zirconia sintered body produced by a general sintering method was prepared as Comparative Example 1. Further, the characteristics of the structure and the features of the mechanical characteristics of the above-mentioned Example 1 were examined by comparison with Comparative Example 1.

As a result of close examination, in the alumina feedstock powder and zirconia feedstock powder used, the alumina feedstock powder was $\alpha$-$Al_2O_3$ with a purity of 99.5 mass %, a median size of 0.73 μm, and a maximum size of 6.7 μm, while the zirconia feedstock powder was monoclinic zirconia electrically fused powder with a purity of 98 mass %, a median size of 4.7 μm, and a maximum size of 19.1 μm. The main impurities in the alumina feedstock powder were sodium oxide ($Na_2O$) in 0.06 mass % and magnesia (MgO) in 0.06 mass %, while the main impurities in the zirconia feedstock powder were silica ($SiO_2$) in 0.19 mass %, iron oxide ($Fe_2O_3$) in 0.12 mass %, and titania ($TiO_2$) in 0.1 mass %. Here, the median size is the diameter giving a height of 50% in the cumulative number distribution chart, that is, the intermediate size (d50).

These feedstock powders were weighed to give a content of zirconium of 20 mass %. These were placed in a plastic pot together with the same weight of alumina balls of diameters of 10 mm and a purity of 99.9 mass % or more. Further, acetone of an extent whereby the powders were concealed was placed in the plastic pot. These were kneaded wet for 6 hours, pulverized, and dried, then passed through a $\phi$250 μm sieve. The obtained powder was used as the mixed feedstock powder. The median size of the mixed feedstock powder was 0.73 μm, while the maximum size was 8.2 μm. The impurities in the mixed feedstock powder were confirmed by ICP emission spectrometry, whereupon it was confirmed that calcium was contained in 0.01 mass %, yttrium in 0.02 mass %, magnesia in 0.06 mass %, and cerium in 0.01 mass % or less and that almost no stabilizing components of zirconia were contained.

Further, this mixed feedstock powder was used to form a composite ceramic layer on a pure copper sheet of 22×22×t2 mm. Specifically, the sufficiently dried mixed feedstock powder was charged into an aerosol chamber. While shaking the aerosol chamber, 12 liter/min of nitrogen gas was sent into the aerosol chamber to form an aerosol. Next, the aerosol was transferred to the film forming chamber reduced in pressure to 0.1 kPa using the pressure difference. This was sprayed from a nozzle of an aperture size of 0.3 mm in the X-direction and 5 mm in the Y-direction on a pure copper sheet (copper base member layer) forming the horizontally driven base member layer to form a film on the surface of the pure copper sheet. The flow rate of the gas passing through the nozzle was 133 m/s.

The driving speed of the base member was 0.5 mm/s in the X-direction. The member was driven 25 mm, then the film forming position was shifted 1 mm in the direction perpendicular to the driving direction (Y-direction). This was repeated every layer and direction of film formation (1 mm pitch) to form a planar film. The member was driven 30 mm in the Y-direction, then the Y-direction driving operation was reversed to form the film. The nozzle was then returned to its original position. When the number of layers formed became 2, the Y-direction driving operation was again reversed. That is, the film forming region became 25×30 mm. The copper base member was placed at the center of the film forming region. The operation for forming a layer was performed 30 times. In this way, a ceramic laminate comprised of a 22×22 mm square copper base member on one entire surface of which a composite ceramic layer was laminated was prepared. This was used as Example 1.

The film forming surface of Example 1 was analyzed by X-rays, whereupon it was learned that it was comprised of an alumina phase and zirconia phase. The peak of the alumina phase matched $\alpha$-$Al_2O_3$. On the other hand, it was learned that the peak of the zirconia phase was also present in not only the monoclinic crystals the same as the zirconia feedstock powder, but also the high temperature phase tetragonal crystals despite heating not being performed for sintering and a stabilizer not being contained. The components of the film surface were confirmed by fluorescent X-rays, whereupon the zirconia stabilizers of yttrium, cerium, calcium, magnesium, and rare earth elements other than yttrium and cerium were not detected. It was confirmed that these were present in less than the detection limit of 0.05 mass % or less. That is, the total of the yttrium and cerium in the film was 0.1 mass % or less.

The diffraction peaks of the X-rays of the alumina phase and zirconia phase were shifted to the somewhat low angle side compared with powder with no strain. The extent differed depending on the peak, but considering also the comparison with the peak of copper of the base member layer, it is guessed that a compressive stress of 100 MPa to 2 GPa or so enters in at least the in-plane direction.

Figure 4:
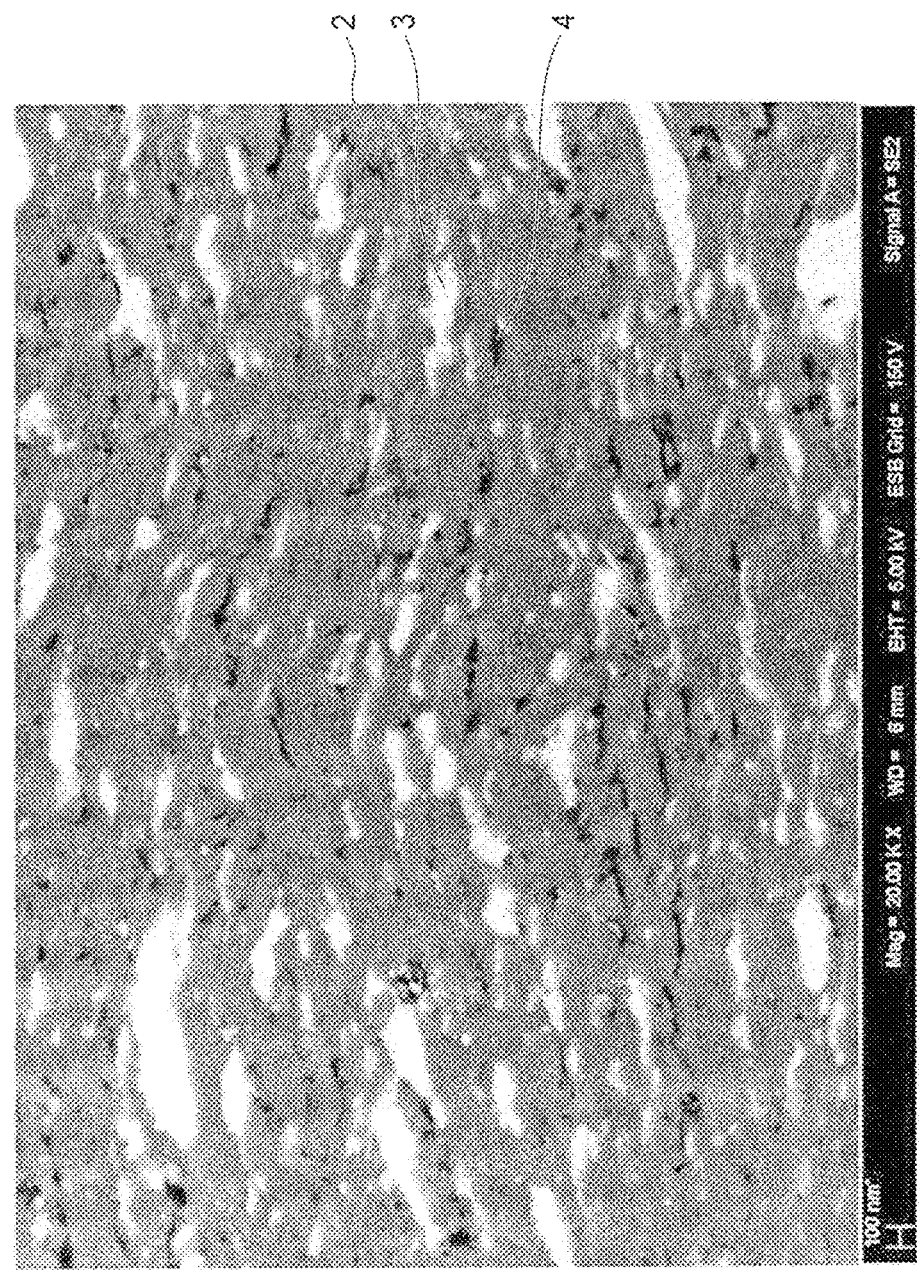
FIG. 4 is a backscattered electron image when observing any cross-section perpendicular to bonding interfaces of a composite ceramic layer and base member in the ceramic laminate of the present invention prepared in Example 1 by a field emission type scan electron microscope.

Next, the cross-section perpendicular to the bonding interfaces of the copper base member layer and the composite ceramic layer was polished to a mirror finish and was treated to make it conductive by extremely thin carbon, then the cross-section was examined. This was examined using an FE-SEM (ULTRA55, made by Zeiss). As a result, it was learned that the surface of the copper base member layer was formed with a film of a thickness of 50 µm (composite ceramic layer). The structure of the composite ceramic layer was examined in detail by examining the backscattered electron image with an acceleration voltage of 5 kV and a power of 20000×. The image obtained as a result is shown in FIG. 4. In FIG. 4, the horizontal direction on the drawing sheet (direction in which caption of backscattered electron image is arranged) shows the direction parallel to the bonding interfaces of the copper base member layer and composite ceramic layer while the vertical direction on the drawing sheet shows the direction vertical to the bonding interfaces. The size of the field is 5.66×4.25 µm.

As shown in FIG. 4, it is learned that the composite ceramic layer 1 is comprised of a gray first phase 2 of intermediate contrast and the greatest area ratio, second phase particles 3 appearing in bright contrast in a particle shape, and voids 4 appearing crushed black. An energy dispersive X-ray analyzer attached to an FE-SEM was used to analyze the composite ceramic layer 1. As a result, it was learned that the first phase 2 was an alumina phase and the particle-shaped second phase particles 3 were a zirconia phase.

It was confirmed that the zirconia phase forming the second phase particles was crushed flat in the direction vertical to bonding interfaces. The size was smaller than the center size of the mixed feedstock powder. Under 20000× magnification, it was theoretically possible to detect particles of a diameter of 0.002 µm or more from the size of the pixels. Particles of a diameter of 0.01 µm or less were also observed, but particles of 0.01 µm or more accounted for 99% or more or almost the entire area ratio. On the other hand, the crystal grains of the alumina phase of the first phase were flattened in the same way as the second phase particles of the zirconia phase. The size of the crystal grains was finer than the second phase particles.

In both the first phase and the second phase particles, the aspect ratios of the longitudinal direction and lateral direction were large. Laminar structures substantially parallel to the bonding interfaces were exhibited, but these were not completely parallel but were formed varying in an undulating manner.

To view the characteristics of the second phase particles of the zirconia phase, image processing was performed to analyze the form. For comparison, the cross-section of a thickness 0.3 mm alumina-zirconia sintered body prepared by sintering a green sheet formed by the doctor blade method (Comparative Example 1) was also examined. This alumina-zirconia sintered body was treated to introduce yttria to partially stabilize it. The cross-section observed in Comparative Example 1 is the cross-section having the sheet thickness direction as the longitudinal direction and the sheet surface direction as the lateral direction. The method of adjustment of Comparative Example 1 is the same as Example 1.

Backscattered electron images were taken for five fields with different field positions in sample cross-sections of two types of samples of Example 1 and Comparative Example 1. The acceleration voltage and other observation conditions were substantially the same, but the size of the second phase particles in Comparative Example 1 was one order greater than the size of the second phase particles (zirconia phase) of the composite ceramic layer prepared by the AD method, so the imaging power in Example 1 was made the same 20000× as in FIG. 4, while the imaging power in Comparative Example 1 was made 1/10 of that or 2000×. The size of the latter field was 56.6×42.5 µm.

The thus obtained backscattered electron image was processed using image processing software (Image Pro, made by Nippon Roper) to analyze the form of the zirconia phase (second phase particles) and calculate the area ratio of the voids. The results of analysis of the form of the zirconia phase are shown in Table 1.

TABLE 1

Results of Analysis of Form of Zirconia Phase

| | Size of 1 field (pm) | No. of fields examined | Total no. of grains | Area ratio (%) | Maximum size (μm) | Average size (μm) | Long/short axis ratio | Ratio of particles with orientation angle of 30° or less (%) | Average orientation angle (°) |
|---|---|---|---|---|---|---|---|---|---|
| Ex. 1 | 5.66 × 4.25 | 5 | 1735 | 14.6 | 0.576 | 0.0831 | 2.59 | 80.7 | 19.6 |
| Comp. Ex. 1 | 56.6 × 42.5 | 5 | 3551 | 14.6 | 5.08 | 0.671 | 1.82 | 42.7 | 40.0 |

The indicators in Table 1 and the procedures for finding the indicators were as follows:

First, to extract only the zirconia phase forming the second phase particles from the backscattered electron image showing the composite ceramic layer, the backscattered electron image was binarized. Further, in the binarized image (binary image), the number of second phase particles (zirconia phase) of the particles of sizes of 0.01 μm or more, accounting for almost the entire area (total number of particles), and the total area ratio of the same were obtained. Here, the sizes of the particles were obtained by converting the number of pixels of a binary image of the second phase particles to area and calculating the circle equivalent diameters.

Similarly, the maximum size and average size of the second phase particles were obtained by converting the number of pixels of the binary image of the individual second phase particles into area to calculate the circle equivalent diameters, using the maximum value as the maximum size, and calculating the average size by dividing the total of the circle equivalent diameters of the individual second phase particles by the total number of particles of the second phase particles.

The characteristics of the aspect ratios and orientations of the second phase particles were statistically processed by replacing the individual second phase particles obtained by the binary image with the equivalent ellipses. Here, an "equivalent ellipse" means an ellipse with zero-order, primary, and secondary moments matching the cross-section of the second phase particles covered. That is, the "equivalent ellipse" is an ellipse which has the same area and center of gravity as the cross-section of a second phase particle covered and which is defined for quantifying and evaluating the direction of the long axis, the direction of the short axis, and the aspect ratio.

The "average of the ratios of the long axes and short axes of the second phase particles" showing the aspect ratios of the second phase particles of the present invention is the average value of the total value of the ratios of the equivalent ellipse long axes and the equivalent ellipse short axes when viewing the respective second phase particles as ellipses divided by the total number of particles of the second phase particles. In Table 1, this is indicated as the "long-short axis ratio".

In Table 1, the "orientation angle" indicates the absolute value when expressing the angle formed by the direction of the equivalent ellipse long axis of each individual second phase particle and the planar direction of the bonding interfaces of the base member layer and composite ceramic layers of the ceramic laminate (that is, image horizontal direction) by ±180°. From the symmetry of an equivalent ellipse, the orientations of the individual second phase particles take values of ±90°. That is, the smaller the angle of the orientation angle, the smaller the edge formed by the direction of the equivalent ellipse long axis and the planar direction of the bonding interfaces. The flattened second phase particles are crushed in a direction close to the normal of the bonding interfaces. When the orientation angle is smaller than 45°, it means the flattened second phase particles are at repose with respect to the bonding interfaces. When the orientation angle is larger than 45°, it means the flattened second phase particles are upright on the bonding interfaces. In Table 1, the "Ratio of particles with orientation angle of 30 (or less" indicates the ratio with respect to the total number of particles of second phase particles with orientation angles of 30° or less and directions of long axes of the equivalent ellipses close to the planar direction of the bonding interfaces. Further, the "average orientation angle" is the average value when dividing the total of the orientation angles of the individual second phase particles by the total number of particles of the second phase particles.

The area ratio of the second phase particles to the first phase in Example 1 and Comparative Example 1 both match 14.6%. However, it was learned that the form of the second phase particles greatly differs. First, in Example 1 and Comparative Example 1, the size of the second phase particles differs by close to one order of size. In Example 1, the average size was a fine one of ⅐ or less of Comparative Example 1. The aspect ratios were larger in Example 1 than Comparative Example 1.

In the software used in the examples, it is possible to analyze the maximum values of the vertical length (vertical Feret diameter) and horizontal (scissor diameter (horizontal Feret diameter)) length of the rectangle circumscribing a second phase particle. The difference between the length of the long axis and the length of the short axis evaluated by the vertical Feret diameter and horizontal Feret diameter and the ratio of the same and the long axis and short axis of the equivalent ellipse prescribed by the present invention and the long/short axis ratio of the same was 10% or less.

Comparative Example 1 had aspect ratios of second phase particles of about 1. It is believed that the aspect ratios became large because the second phase particles were connected with each other in a direction vertical to the sheet thickness. The aspect ratios of the individual second phase particles are further different.

The ratio of second phase particles of the orientation angle of 30° or less exceeds 80% in Example 1. It was learned that the second phase particles of Example 1 are flat and oriented crushed in the normal direction of the bonding interfaces with respect to the bonding interfaces of the base member layer and composite ceramic layer. Further, the fact that in Example 1, the average orientation angle is not 0°, but about 20° reflects the fact that the second phase particles have laminar structures parallel with the bonding interfaces, but these are not completely parallel but are formed varying in an undulating manner. On the other hand, the average orientation angle of the alumina-zirconia sintered body of Comparative Example 1 was 40°. This was a value close to the 45° in the case of facing completely random directions.

The sheet surface of Comparative Example 1 was analyzed by X-ray wide angle diffraction in the same way as Example 1. As a result, in the same way as Example 1, the zirconia phase forming the second phase particles was comprised of a mixture of tetragonal crystals and monoclinic crystals. Further, the base phase $\alpha$-$Al_2O_3$ was confirmed. The X-ray diffraction peaks in Example 1 and Comparative Example 1 substantially matched those of powders with no strain or were shifted slightly to the higher angle side. It is guessed that there is substantially no strain the in-plane direction or some tensile stress acts.

Using the same method as the image analysis of the zirconia phase, the image is binarized so as to extract the dark contrast of the voids so as to measure the area ratio of the voids. As a result, in the material of the example, the maximum value of one field was 4.91% and the average was 2.21%, while in the material of the comparative example, the maximum value of one field was 5.09% and the average was 0.72%. In the comparative example, the field in which the maximum value appeared was due to a large void incidentally being in the observed field, so when calculating the average value, this was excluded. The sample of the comparative example had locations with locally large voids.

The composite ceramic layers of Example 1 and Comparative Example 1 were measured for Vickers hardness. The surfaces of the composite ceramic layers of Example 1 and Comparative Example 1 were slightly polished, then a diamond indenter (below, also simply referred to as an "indenter") was pushed in by a load of 100 gf, held for 15 seconds, then raised up. This operation was repeated a sufficient distance away. Thin carbon was deposited and FE-SEM was used to examine the indentations and cracks.

The Vickers hardness was in the range of 16 GPa±2 GPa. On the other hand, from the top part of the indenter, in each of the samples of Example 1 and Comparative Example 1, crack progression was observed in a diagonal direction of the indenter, but the length of the cracks was smaller in Example 1 than Comparative Example 1. It was learned that the fracture toughness of Example 1 was higher than Comparative Example 1.

On the other hand, the cross-section vertical to the bonding interfaces of Example 1 and the cross-section in the thickness direction of Comparative Example 1 were both measured for hardness. The samples of Example 1 and Comparative Example 1 were buried in polishing burial-use resin, then the cross-sections were polished to a mirror finish and an indenter was pushed in at the center in the sheet thickness direction and the hardness measured. The indenter was pushed in, in the sheet thickness direction (in Example 1, direction vertical to bonding interfaces) and the sheet parallel direction parallel to the sheet surface (in Example 1, direction parallel to bonding interfaces) by a load of a load of 70 gf and held there for 15 seconds, then the indenter was raised. The operation was repeated at sufficient distances. The direction of the indenter was set so that perpendicularly intersecting diagonal lines connecting the vertexes of the Vickers impression forming a substantially square shape when viewed from above the polishing surface became vertical and parallel to the film thickness direction. After that, thin carbon was deposited on the polished surface and FE-SEM was used to examine the indentations and cracks.

The cracks in the direction parallel to the sheet surface were formed along the interfaces of the second phase particles in both Example 1 and Comparative Example 1, but Example 1 was smaller in width overall compared with Comparative Example 1. In the samples of Example 1 and Comparative Example 1 as well, the cracks were observed to bypass the second phase particles, but in Comparative Example 1, the cracks proceeded along the interface of the second phase particles. The state where the cracks passed through the second phase particles in proceeding further was observed. On the other hand, if investigating the relationship between the cracks and structure in Example 1, it was confirmed that at the second phase particles and in their vicinities, there was a high frequency of the cracks being bent in direction to avoid them. Further, in Example 1, when checking for cracks in the parallel direction parallel to the bonding interfaces, it was observed that the cracks were bent in along the winding path of the second phase particles seen in FIG. 4 connected while curving.

On the other hand, regarding the sheet thickness direction, in the sample of Comparative Example 1, it was observed that a crack of the same extent as the horizontal direction progressed from the top part of the indenter in the diagonal direction of the impression, that is, the sheet thickness direction, but in Example 1, no crack could be confirmed at all. From this, in Example 1 of the present invention, it was confirmed that the fracture toughness in the direction vertical to bonding interfaces was extremely excellent.

The spread of the crack as a whole was small in Example 1 since even if the area ratio (volume ratio) of the second phase particles is the same, there was a high probability of the advancing crack tip and the second phase particles becoming close to each other. That is, this is due to the greater opportunities for the direction of crack progression to be changed by the stress field clue to the mixture of the alumina phase (first phase) and zirconia phase (second phase particles). Further, in Example 1, (i) the material is produced by a process not passing through the phase transformation temperature of the zirconia phase and, despite using a monoclinic material, is able to prevent the formation of a large crack due to a change in volume accompanying phase transformation of the zirconia phase and (ii) further even without yttria, ceria, calcia, magnesia, or another stabilizer, a tetragonal zirconia phase is introduced at room temperature, so can cause action of a mechanism absorbing the energy of the front of a crack due to stress-induced transformation. This also can contribute to improvement of the fracture toughness.

On the other hand, compared with Comparative Example 1 (alumina-zirconia sintered body) where the fracture toughness is relatively equal in the direction vertical to bonding interfaces, Example 1 is extremely excellent in fracture toughness in the direction vertical to the bonding interfaces because of (i) the effect of not only the second phase particles of the zirconia phase, but also the crystal grains of the alumina phase of the first phase being flat and the cracks advancing through the crystal grain boundaries in the direction perpendicular to the bonding interfaces being greatly diverted and (ii) the effect of having a particularly strong compressive stress in the in-plane direction so tensile stress of the frontal zone of the crack being cancelled out by this compressive stress and the energy of the opening of the crack tip becoming smaller.

The sample of the example was measured for dielectric breakdown electric field in the film thickness direction. This was performed based on JIS C2110 (2010) by the setup of FIG. 1(c) with the upper electrode changed to a diameter 12.5 mm ball electrode. The measurement was conducted immersed in oil under DC stress. As a result, the breakdown electric field value of the average of three points was $270 \times 10^6$ V/m. The breakdown electric field value of a general alumina-based sintered body is 10 to 18×10$^6$V/m, so it was learned that the sample had a 10 times or more greater insulation performance.

In the above way, the ceramic laminate of the present invention comprised of a composite ceramic layer with second phase particles arranged finely with variation in a specific direction laminated on a base member layer is shown as exhibiting an excellent mechanical characteristic. Such a ceramic laminate not only can be used for a structure such as a conveyor roll requiring mechanical characteristics but also can be used as a ceramic insulating substrate in which a base member layer comprised of copper, aluminum, or another metal and a ceramic layer greatly different in coefficient of thermal expansion are often integrally provided. When using the ceramic laminate of the present invention as a ceramic insulating substrate, by improving the mechanical characteristics of the composite ceramic layer, it is possible to reduce the thickness of the composite ceramic layer more than the past while realizing a ceramic insulating substrate with a high heat dissipation ability. Further, the ceramic laminate of the present invention uses the effect due to the special structure of the composite ceramic and the effect of the tensile stress remaining in the ceramic occurring at the time of production of the laminate becoming smaller so as to prolong the life with respect to the tensile thermal stress due to a repeated thermal cycle and can realize a ceramic insulating substrate having an excellent durability.

Example 2

Two types of feedstocks were used to make prototypes of alumina-zirconia ceramic mainly comprised of zirconia. One was a material made by forming a feedstock obtained by mixing a commercially available alumina powder and zirconia powder into a film by the aerosol deposition method (Sample 3) while the other was a material made into a film by the aerosol deposition method using commercially available alumina-zirconia mixed powder as a feedstock (Sample 4).

Both of the feedstocks were mainly comprised of zirconia containing alumina in 20 mass % and contained yttria for stabilization of zirconia.

The feedstock powders of Sample 3 were the alumina powder used for Example 1 and a partially stabilized zirconia electrically fused powder. The zirconia electrically fused powder was partially stabilized and contained 5.5 mass % of yttria with respect to zirconia. The center particle size (median size) was 3.5 μm. The zirconia and alumina were weighed to give zirconia of 20 mass %, were placed in a Teflon ball mill pot, and were kneaded together with diameter 10 mm alumina balls and ethanol for 10 hours. The powder was taken out and sufficiently dried. This powder was dispersed in an aqueous dispersion and measured for particle size, whereupon the median diameter was 0.9 μm. The content of yttria with respect to the total amount of alumina-zirconia feedstock powder was calculated as 4.4 mass %.

On the other hand, in the commercially available alumina-zirconia powder used for the feedstock of Sample 4, the ratio of zirconia and alumina is the same as the feedstock powder of Sample 3. The zirconia contains 3 mol % of yttria and is similarly partially stabilized, but the zirconia is produced by a chemical technique utilizing hydrolysis. The primary particle size is a small one of about 0.09 μm. The aspect ratio is also small.

These powders were formed into films under the same conditions as the aerosol deposition method. For the base member, 50×50×5 mm Cr—Mo steel was used. The mixed feedstock powder sufficiently dried on this substrate was charged into the aerosol chamber. While shaking the inside of the aerosol chamber, 10 liter/min of nitrogen gas was sent into the aerosol chamber to form the aerosol. Next, the aerosol was transferred to the film forming chamber reduced in pressure to 0.3 kPa using the pressure difference. This was sprayed from a nozzle of an aperture size of 0.3 mm in the X-direction and 5 mm in the Y-direction on the Cr—Mo steel sheet forming the horizontally driven base member layer to form a film.

The driving speed of the base member was 1 mm/s in the X-direction. After the member was driven for 30 mm, the driving direction was reversed, the member was driven for 30 mm, and the driving direction was again reversed. This was repeated to form a film of a thickness of 10 μm in a 5×30 mm region and prepare an alumina-zirconia laminate having Cr—Mo steel as a base member.

The thus prepared laminate was examined. The film forming surfaces of Sample 3 and Sample 4 were analyzed by X-ray analysis and Raman spectroscopy to identify the component phases, whereby it was learned that in each case, the laminate was comprised of an alumina phase and zirconia phase. The peak of the alumina phase matched α-Al$_2$O$_3$. On the other hand, it was learned that the peak of the zirconia phase was present in all of the tetragonal crystals and cubic crystals.

Next, the center part of the film forming region was cut in the Y-direction vertical to the film surface, buried in resin, then polished to a mirror finish and treated to form a mirror surface. The secondary electron image of the scan type electron microscope was used to examine the structure. 10 fields were measured at an acceleration voltage of 5 kV and by a secondary electron image of a magnification of 20000× while changing the location so as to calculate the maximum value and average value. In the sample of this example, the second phase is alumina. Image processing was performed to separate the structure into alumina particles and the other zirconia base phase and voids to analyze the form of the alumina particles. Further, the same image was used to separate the structure into voids and the other alumina articles and zirconia base phase to calculate the area ratio of the voids. Among the alumina particles, particles of 0.01 μm or less were also seen, but particles of 0.01 μm or more accounted for almost all of the area ratio. The total number of alumina particles in the 10 fields was 5000 or more. The results of analysis of the form of the alumina particles are shown in Table 2. The image analyzing software used and the definitions of the indicators showing the form of the particles are the same as in Example 1.

TABLE 2

Results of Analysis of Form of Alumina Particles

|  | Area ratio (%) | Maximum size (μm) | Average size (μm) | Long/short axis ratio | Ratio of particles with orientation angle of 30° or less (%) | Average orientation angle (°) | Remarks |
|---|---|---|---|---|---|---|---|
| Sample 3 | 26.7 | 0.498 | 0.135 | 2.32 | 65.1 | 25.8 | Example |
| Sample 4 | 23.8 | 1.53 | 0.189 | 1.91 | 58.1 | 38.9 | Comparative example |

The alumina particles in Sample 3 were large and flat, were large in long/short axis ratio, and satisfied the structural provisions of the present invention. On the other hand, the sizes of the alumina particles of Sample 4 satisfied the provisions of the present invention, the area ratio of the voids of Sample 3 was 0.69%, while the area ratio of voids of Sample 4 was a large 9.8%. Further, Sample 4 had long/short axis ratios outside the prescribed range. Furthermore, the ratio of second phase particles with an orientation angle of 30° or less and the average orientation angle of Sample 4 were outside the preferable ranges. The crystal grains of the zirconia phase of the base phase in Sample 3 were a size equal to the alumina particles and flat, but in Sample 4, the individual crystal grains were small in size, but the degree of flatness was small. Further, despite the primary particles of the zirconia feedstock particles being fine, the zirconia base phase had many voids and were porous.

The maximum size of the alumina particles of Sample 4 was large probably because the alumina feedstock particles in the aerosol, which usually cannot deform on a dense film and cannot form a film, but end up falling off, end up being left in the film in a form physically buried due to the film not deforming or breaking. The reasons are that the film is porous, the deformation of particles is small, and the bonding force between particles forming the film is small. Furthermore, the bonding force at the interface of the simply entrained particles and their surrounding particles is weak. Around such particles, large voids are formed due to deformation, breakage, etc., so become causes of reduction of mechanical characteristics.

In actuality, the films of Sample 3 and Sample 4 were strongly rubbed from above by tweezers to abrade them, whereupon Sample 3 did not peeled off at all at the inside of the film and at the interface of the film and base member, while the film of Sample 4 was broken and shaved off inside the film. The difference between Sample 3 and Sample 4 is due to the difference in the structures of the films explained above.

Example 3

Using zirconia of different compositions and crystal structures, alumina-zirconia ceramic laminates were prepared and evaluated for mechanical characteristics and electrical characteristics.

The feedstock powder of Sample 5 is an alumina-zirconia mixed powder with a content of zirconium of 12 mass %. For kneading the feedstock mixed powder, a ball mill was utilized. The feedstock alumina is the same as that used for Example 1. Further, zirconia is an electrically fused powder with the same components and amounts of impurities as Example 1 but not containing the stabilizing elements. A finely crushed commercially available product with a particle size of a median size of 1.1 μm and a maximum size of 11 μm was utilized.

These feedstock powders were weighed to give a content of zirconium of 12 mass % and a content of alumina of 88 mass %. These were placed in a plastic pot together with alumina balls of diameters of 10 mm and a purity of 99.9 mass % or more. Further, ethanol of an extent whereby the powders were concealed was placed in the plastic pot. These were kneaded wet for 20 hours, pulverized, and dried, then passed through a φ250 μm sieve. The obtained powder was used as the mixed feedstock powder. The median size of the mixed feedstock powder was 0.48 μm, while the maximum size was 3.8 μm.

These powders were formed into films under the same conditions as the aerosol deposition method. For the base member, a 40×40×1 mm oxygen-free copper sheet was used. The mixed feedstock powder sufficiently dried on this substrate was charged into the aerosol chamber. While shaking the inside of the aerosol chamber, 8 liter/min of nitrogen gas was sent into the aerosol chamber to form the aerosol. Next, the aerosol was transferred to the film forming chamber reduced in pressure to 0.3 kPa using the pressure difference. This was sprayed from a nozzle of an aperture size of 0.3 mm in the X-direction and 5 mm in the Y-direction on the Cu sheet forming the horizontally driven base member layer to form a film.

The driving speed of the base member was 0.5 mm/s in the X-direction. After the member was driven for 30 mm, the driving direction was reversed, the member was driven for 30 mm, and the driving direction was again reversed. This was repeated to form a film of a thickness of 80 μm in a 5×30 mm region.

The feedstock powder of Sample 6 is an alumina-zirconia mixed powder with a content of zirconia of 20 mass %. For kneading the feedstock mixed powder, a ball mill was utilized. The feedstock alumina is the same as that used for Example 1. Further, zirconia is a commercially available partially stabilized zirconia containing 5.5% of yttria. A fine commercially available product with a particle size of a median size of 1.1 μm and a maximum size of 13 μm was utilized.

These feedstock powders were weighed to give contents of zirconium of 20 mass % and contents of alumina of 80 mass %. These feedstock powders were placed in a plastic pot together with alumina balls of diameters of 10 mm and a purity of 99.9 mass % or more. Further, ethanol of an extent whereby the powders were concealed was placed in the plastic pot. These were kneaded wet for 20 hours, pulverized, and dried, then passed through a φ250 μm sieve. The obtained powder was used as the mixed feedstock powder. The median size of the mixed feedstock powder was 0.63 μm, while the maximum size was 5.4 μm. The content of yttria in the alumina-zirconia feedstock powder was calculated as 1.1%.

This powder was formed into a film under the same conditions as in the aerosol deposition method. For the base member, an oxygen-free copper sheet of 40×40×1 mm the same as Sample 5 was used. The mixed feedstock sufficiently dried on this substrate was charged into the aerosol chamber. While shaking the inside of the aerosol chamber, 12 liter/min of nitrogen gas was sent into the aerosol chamber to form the aerosol. Next, the aerosol was transferred to the film forming chamber reduced in pressure to 0.04 kPa using the pressure difference. This was sprayed from a nozzle of an aperture size of 0.3 mm in the X-direction and 5 mm in the Y-direction on the Cu sheet forming the horizontally driven base member layer to form a film.

The driving speed of the base member was 0.5 mm/s in the X-direction. After the member was driven for 30 mm, the driving direction was reversed, the member was driven for 30 mm, and the driving direction was again reversed. This was repeated to form a film of a thickness of 80 μm in a 5×30 mm region.

The feedstock powder of Sample 7 was an alumina-zirconia mixed powder with a content of zirconia of 50 mass %. The feedstock mixed powder was kneaded utilizing a ball mill. The feedstock alumina was the same as that used in Example 1. Further, the zirconia was the commercially available stabilized zirconia containing 8.07% of yttria. A fine commercially available product with a particle size of a median size of 1.7 μm and a maximum size of 13 μm was utilized.

These feedstock powders were weighed to give contents of alumina and zirconia of respectively 50 mass %. These were placed in a plastic pot together with the same weight of alumina balls of diameters of 10 mm and a purity of 99.9 mass % or more. Further, ethanol of an extent whereby the powders were concealed was placed in the plastic pot. These were kneaded wet for 20 hours, pulverized, and dried, then passed through φ250 μm sieve. The obtained powder was used as the mixed feedstock powder. The median size of the mixed feedstock powder was 0.72 μm, while the maximum size was 5.4 μm. The content of yttria in the alumina-zirconia feedstock powder was calculated as 4.04%.

This powder was formed into a film under the same conditions as the aerosol deposition method. For the base member, an oxygen-free copper sheet of 40×40×1 mm the same as Sample 5 was used. The mixed feedstock sufficiently dried on this substrate was charged into the aerosol chamber. While shaking the inside of the aerosol chamber, 10 liter/min of nitrogen gas was sent into the aerosol chamber to form the aerosol. Next, the aerosol was transferred to the film forming chamber reduced in pressure to 0.1 kPa using the pressure difference. This was sprayed from a nozzle of an aperture size of 0.3 mm in the X-direction and 5 mm in the Y-direction on the Cu sheet forming the horizontally driven base member layer to form a film.

The driving speed of the base member was 0.5 mm/s in the X-direction. After the member was driven for 30 mm, the driving direction was reversed, the member was driven for 30 mm, and the driving direction was again reversed. This was repeated to form a film of a thickness of 80 μm in a 5×30 mm region and prepare an alumina-zirconia laminate having copper as a base member.

The above prepared samples of Samples 5 to 7 were analyzed by X-ray diffraction and Raman spectroscopy to identify the component phases, wherein it was learned that all were comprised of an alumina phase and zirconia phase. The peaks of the alumina phases matched $\alpha\text{-}Al_2O_3$. On the other hand, the peaks of the zirconia phases respectively differed. Sample 5 contained monoclinic crystals and tetragonal crystals. Sample 6 and Sample 7 were mainly comprised of tetragonal crystals and cubic crystals but included some monoclinic crystals.

Further, the film surfaces in the respective samples were analyzed by fluorescent X-rays, whereupon in Sample 5, no rare earth elements, including yttrium, were detected. It was confirmed that the total of yttrium and cerium was 0.1 mass % or less after subtracting the copper of the base member.

Figure 5:
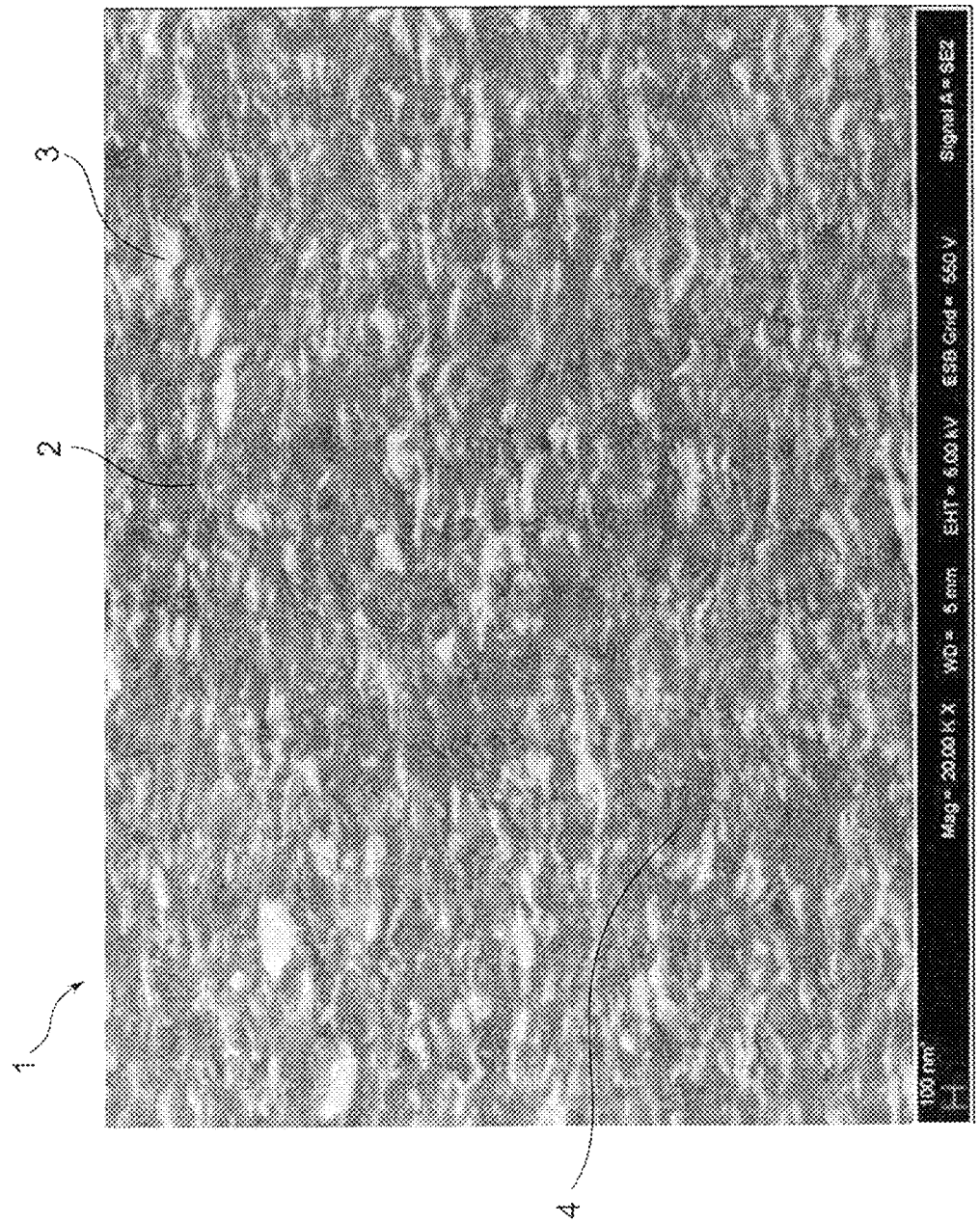
FIG. 5 is a secondary electron image when observing any cross-section perpendicular to bonding interfaces of a composite ceramic layer and base member in the ceramic laminate of the present invention prepared in Example 3 by a field emission type scan electron microscope.

Next, the center part of each film forming region was cut in the Y-direction vertical to the film surface, buried in resin, then polished to a mirror finish and treated to form a mirror surface. The secondary electron image of a scan type electron microscope was used to examine the structure. 10 fields were measured at an acceleration voltage of 5 kV and by a secondary electron image of a magnification of 20000× while changing the location so as to calculate the maximum value and average value. In each sample of the example, the second phase is zirconia particle. Image processing was performed to separate the structure into zirconia particles and the other alumina base phase and voids to analyze the form of the zirconia particles. Further, the same image was used to separate the structure into voids and the other zirconia particles and alumina base phase to calculate the area ratio of the voids. Among the zirconia particles, particles of 0.01 μm or less were also seen, but particles of 0.01 μm or more accounted for almost all of the area ratio. The total number of zirconia particles in the 10 fields was 3000 or more. The results of analysis of the form of the zirconia particles are shown in Table 3. The image analyzing software used and the definitions of the indicators showing the form of the particles were the same as in Example 1 and Example 2. Further, the secondary electron image of Sample 6 was shown in FIG. 5 as one example of an image used for structural analysis. In FIG. 5, the up-down direction (direction vertical to direction in which caption of backscattered electron image is arranged) is the film thickness direction. Samples 4 and 6 were different in area ratios of the zirconia phases, but similarly exhibited fine structures.

TABLE 3

Results of Analysis of Form of Zirconia Particles

|  | Area ratio (%) | Maximum size (μm) | Average size (μm) | Long/short axis ratio | Ratio of particles with orientation angle of 30° or less (%) | Average orientation angle (°) | Remarks |
|---|---|---|---|---|---|---|---|
| Sample 5 | 6.16 | 0.363 | 0.0794 | 2.55 | 75.5 | 25.8 | Example |
| Sample 6 | 14.2 | 0.358 | 0.0679 | 2.81 | 80.1 | 17.0 | Example |
| Sample 7 | 32.1 | 0.378 | 0.0812 | 2.51 | 77.2 | 23.1 | Example |

The films of Sample 5 to Sample 7 were all comprised of fine crystal grains having alumina as the base phase and zirconia phase as the second phase. Further, the crystal grains of the alumina base phase could be discerned in the backscattered electron images, but the films were comprised of crystal grains of the same extent as the zirconia particles and exhibited structures strongly flattened in the film thickness direction. There were few voids and the structures were dense. The area ratio of voids calculated from image analysis in Sample 5 was 0.311%, in Sample 6 was 0.0564%, and in Sample 7 was 0.121%. The densities were higher compared with Example 1 probably because the feedstock particles were finer.

In Sample 5 to Sample 7, the second phase zirconia particles were greatly flattened, the long/short axis ratios were large, and the provision of the present invention on the structure was satisfied. In particular, the zirconia particles of Sample 6 were strongly deformed and the long/short axis ratio was large. On the other hand, the orientation angle was the smallest among the three samples. As the reason for this, the film forming conditions of Sample 6 included a large gas flow rate and a low film forming chamber pressure, so the speed of the feedstock particles in the aerosol striking the copper base member was the highest. It may also be because the density was the highest among the three samples.

Next, the alumina-zirconia polished surfaces of these three samples were struck by the Vickers indenter and cracks were examined to evaluate the toughness. The Vickers indenter was used by exactly the same method as in Example 1. That is, indenter was pushed against the center of each sheet thickness direction by a force of 70 gf and held there for 15 seconds, then the indenter was raised. This operation was repeated at sufficient intervals. The direction of the indenter was set so that perpendicularly intersecting diagonal lines connecting the vertexes of the Vickers impression forming a substantially square shape when viewed from above the polishing surface become vertical and parallel to the film thickness direction. Normally a crack advances from a vertex in the direction of the diagonal line of that vertex, that is, in this case, a direction parallel to the bonding interfaces of the film thickness direction and base member. The length of this crack can be used to evaluate the toughness of the ceramic.

In the samples of Samples 5 to 7, no cracks were formed in the film thickness direction. In the same way as the ceramic laminate sample of Example 1, these have extremely high fracture toughnesses in the film thickness direction. This is because two types of fine crystals with different elastic moduli were mixed, these strongly deformed in the film thickness direction, and had compressive stress.

In Sample 5, it was found that a crack substantially parallel to the bonding surface with the base member was formed from the Vickers impression starting from the other diagonal vertex. The length was smaller than the alumina-zirconia laminate of Example 1. Despite the volume ratio of zirconia being large and the density of voids being smaller and finer, the fracture toughness was improved because of the size of the dispersed zirconia becoming smaller and uniform, the differences in the process conditions causing the orientation angle of zirconia with a large long/short axis ratio to become larger, and the effect of inhibiting crack progression parallel to the plane vertical to the film thickness direction becoming greater. In actuality, due to the dispersed zirconia, the cracks were stopped. The state of these being bypassed was observed.

In Sample 6 and Sample 7, the lengths of the cracks vertical to the film thickness direction became smaller. This is because the contents of zirconia became larger, in Sample 6, the ratio of tetragonal zirconia with a large action of inhibiting crack progression increased, and, in Sample 7, the ratio of cubic zirconia with excellent strength increased.

Sample 6 was evaluated for insulation ability. The method of evaluation was the same as the examples, but the sample was small, so for the upper electrode, a diameter 1.5 mm electrode ball was used. As a result, it was learned that the breakdown electric field value was an extremely high 510× $10^6$ V/m. The reason is that due to the difference in process conditions, the alumina-zirconia film becomes denser and the crystal grains forming the film deform larger than in the film thickness direction.

REFERENCE SIGNS LIST

1: composite ceramic layer
2: alumina phase (first phase)
3: zirconia phase (second phase particles)
4: voids

The invention claimed is:

1. A ceramic laminate comprised of a base member layer on a partial or an entire surface of which a composite ceramic layer containing an alumina phase and a zirconia phase is covered,
   said ceramic laminate
   having, at any cross-section perpendicular to bonding interfaces of said composite ceramic layer and said base member layer, a structure of a first phase comprised of either of said alumina phase or said zirconia phase in which second phase particles comprised of the other of said zirconia phase or said alumina phase with a smaller total area ratio than said first phase are dispersed and voids, and
   having, when measuring said second phase particles with circle equivalent diameters of 0.01 μm or more in said cross-section-and said voids,
   a maximum value of circle equivalent diameter of said second phase particles of 5 μm or less,
   an average value of circle equivalent diameter of said second phase particles of 0.02 μm to 0.3 μm,
   an average value of the values of long axes of equivalent ellipses when viewing said second phase particles as ellipses divided by the short axes of 2 to 10, and
   an area ratio of said voids of 5% or less.

2. The ceramic laminate according to claim 1, wherein,
   when an angle formed by a planar direction of said bonding interfaces closest in distance to a center of gravity of a second phase particle and the direction of a long axis of an equivalent ellipse of the second phase particle is expressed as an angle of −90° to 90° and an absolute value of the angle is defined as an orientation angle of said second phase particle,
   at any cross-section, 60% or more of the number of said second phase particles have orientation angles of 30° or less, and
   an average orientation angle obtained by dividing a total of said orientation angles by the total number of particles of said second phase particles is 5° to 35°.

3. The ceramic laminate according to claim 1, wherein said base member layer is mainly comprised of copper or aluminum, and
   said composite ceramic layer has a thickness in a direction vertical to said base member layer of 5 μm to 200 μm.

4. The ceramic laminate according to claim 1, wherein said first phase is an alumina phase and said second phase is a zirconia phase.

5. The ceramic laminate according to claim 1, wherein said zirconia phase includes at least tetragonal crystals and the content of yttrium is 0.1 mass % or less.

6. A ceramic insulating substrate comprised of a ceramic laminate according to claim 1.

7. The ceramic insulating substrate according to claim 6, wherein said base member layer is copper or aluminum, and a copper or aluminum circuit is formed on the opposite surface across said composite ceramic layer.

8. The insulating substrate according to claim 7, wherein the thickness of said base member layer is over 0.5 mm and two times or more the thickness of said circuit.

9. A method of production of a ceramic laminate according to claim 1, comprising mixing alumina feedstock particles and zirconia feedstock particles with a gas and spraying said alumina feedstock particles and said zirconia feedstock particles together with said gas toward the surface of the base member layer to make them strike it and thereby form a composite ceramic layer on the surface of said base member layer.

10. The method of production of a ceramic laminate according to claim 9, further comprising:
mixing said alumina feedstock particles with said gas to produce one aerosol and mixing said zirconia feedstock particles with said gas to produce another aerosol and spraying said one aerosol and said other aerosol toward the surface of said base member layer.

11. The method of production of a ceramic laminate according to claim 9, further comprising mixing said alumina feedstock particles and said zirconia feedstock particles, mixing said gas with the mixed feedstock powder to produce an aerosol, and spraying said aerosol toward the surface of said base member layer.

12. The method of production of a ceramic laminate according to claim 9 wherein said zirconia feedstock is an electrically fused powder.

13. The ceramic laminate according to claim 2, wherein
said base member layer is mainly comprised of copper or aluminum, and
said composite ceramic layer has a thickness in a direction vertical to said base member layer of 5 μm to 200 μm.

14. The ceramic laminate according to claim 2, wherein said first phase is an alumina phase and said second phase is a zirconia phase.

15. The ceramic laminate according to claim 3, wherein said first phase is an alumina phase and said second phase is a zirconia phase.

16. The ceramic laminate according to claim 2, wherein said zirconia phase includes at least tetragonal crystals and the content of yttrium is 0.1 mass % or less.

17. The ceramic laminate according to claim 3, wherein said zirconia phase includes at least tetragonal crystals and the content of yttrium is 0.1 mass % or less.

18. The ceramic laminate according to claim 4, wherein said zirconia phase includes at least tetragonal crystals and the content of yttrium is 0.1 mass % or less.

19. A ceramic insulating substrate comprised of a ceramic laminate according to claim 2.

20. A ceramic insulating substrate comprised of a ceramic laminate according to claim 3.

* * * * *